(12) United States Patent
Scherschlicht et al.

(10) Patent No.: US 12,234,547 B2
(45) Date of Patent: Feb. 25, 2025

(54) METHOD FOR OPERATING A COATING INSTALLATION FOR PRODUCING LAYER SYSTEMS

(71) Applicant: RODENSTOCK GMBH, Munich (DE)

(72) Inventors: Rüdiger Scherschlicht, Unterhaching (DE); Stefan Radünz, Gilching (DE)

(73) Assignee: RODENSTOCK GMBH, Munich (DE)

( * ) Notice: Subject to any disclaimer, the term of this patent is extended or adjusted under 35 U.S.C. 154(b) by 488 days.

(21) Appl. No.: 17/414,652

(22) PCT Filed: Dec. 17, 2019

(86) PCT No.: PCT/EP2019/085810
§ 371 (c)(1),
(2) Date: Jun. 16, 2021

(87) PCT Pub. No.: WO2020/127394
PCT Pub. Date: Jun. 25, 2020

(65) Prior Publication Data
US 2022/0049347 A1     Feb. 17, 2022

(30) Foreign Application Priority Data

Dec. 20, 2018   (DE) ................. 10 2018 133 187.8

(51) Int. Cl.
| | |
|---|---|
| *C23C 14/54* | (2006.01) |
| *C23C 16/52* | (2006.01) |
| *G01B 11/06* | (2006.01) |
| *G02B 1/115* | (2015.01) |
| *G02B 27/00* | (2006.01) |

(52) U.S. Cl.
CPC .............. *C23C 14/54* (2013.01); *C23C 16/52* (2013.01); *G01B 11/0616* (2013.01); *G02B 1/115* (2013.01); *G02B 27/0012* (2013.01)

(58) Field of Classification Search
None
See application file for complete search history.

(56) References Cited

U.S. PATENT DOCUMENTS

2015/0021168 A1    1/2015   Lotz

FOREIGN PATENT DOCUMENTS

| | | |
|---|---|---|
| EP | 3 346 023 A1 | 7/2018 |
| WO | WO 2016/110339 A1 | 7/2016 |

OTHER PUBLICATIONS

International Search Report, issued in PCT/EP2019/085810, dated May 11, 2020.
Kheraj et al., "Simulation of reflectivity spectrum for non-absorbing multilayer optical thin films", PRAMANA - Journal of physics, Jun. 2009, vol. 72, No. 6, pp. 1011-1022.

*Primary Examiner* — Michael G Miller
(74) *Attorney, Agent, or Firm* — Birch, Stewart, Kolasch & Birch, LLP

(57) ABSTRACT

A self-controlling feedback method for operating at least one coating installation for producing layer systems, a method for producing a layer system in at least one coating installation, a method for running in a coating process in at least one coating installation for producing a layer system, a coating system for producing a layer system, a coating installation for producing a layer system, a system of coating installations for producing layer systems, a database for storing installation datasets, a computer program product for a method for operating at least one coating installation, and a data processing system for executing a data processing program are disclosed.

18 Claims, 12 Drawing Sheets

METHOD FOR OPERATING A COATING INSTALLATION FOR PRODUCING LAYER SYSTEMS

PRIOR ART

Figure 1:
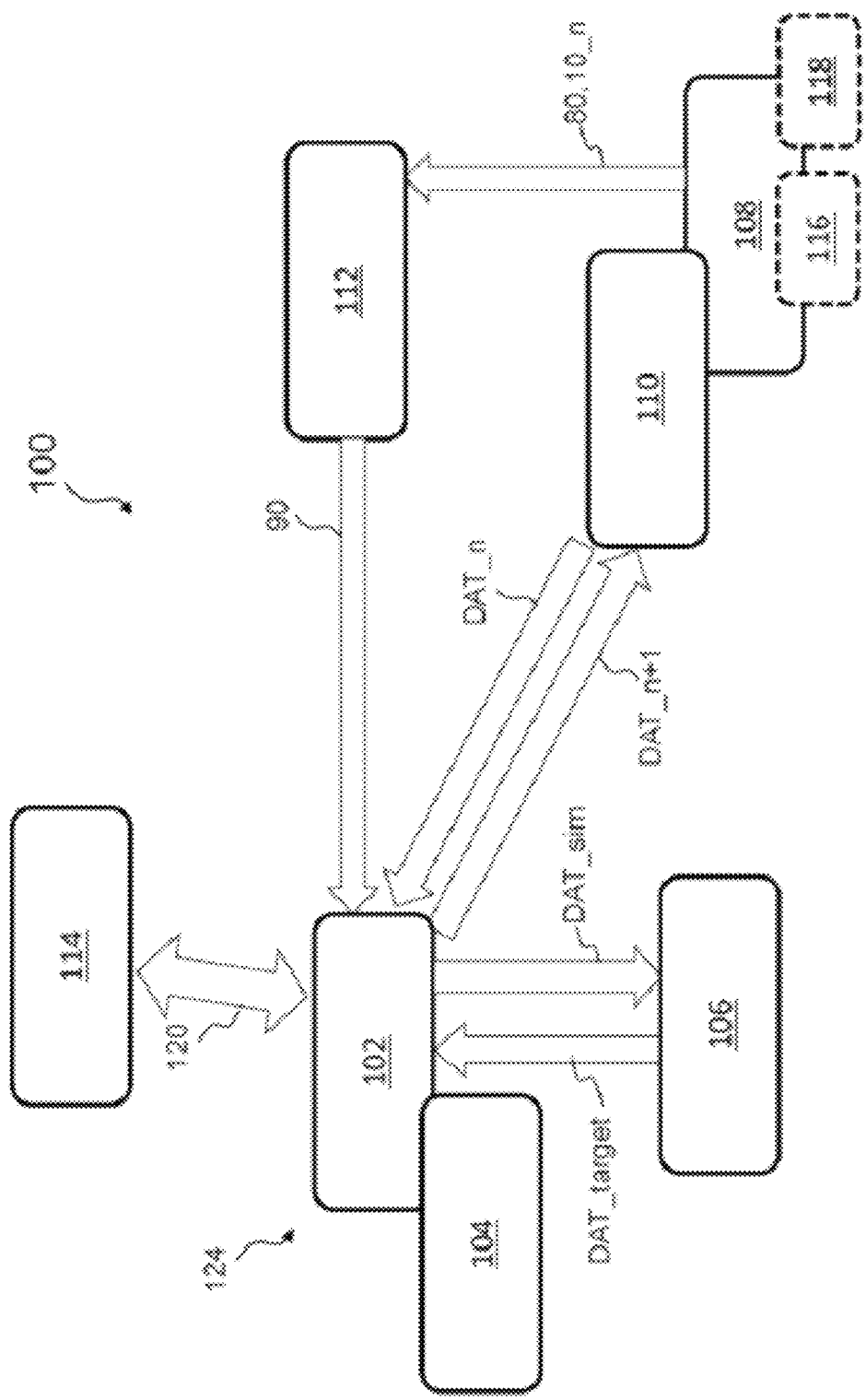

The invention relates to a method for operating a coating installation for the production of layer systems. The invention further relates to a method for the production of a layer system, a method for running-in a coating process in a coating installation, a coating system, a system of coating installations, and a database for storing installation data sets, a computer program product for a method for operating a coating installation, and a data processing system for the execution of a method for operating a coating installation for the production of layer systems.

A coating method implemented in a manufacturing environment with an underlying coating process typically has variations from coating batch to coating batch. These deviations are due to the fact that the condition of the coating installation changes slightly, for example due to deposits of coating material on the walls of the vacuum chamber, operator influences when loading the coating installation with coating material, wear of various components installed in the coating installation and the like.

An economically sensible method to keep the deviations from coating batch to coating batch as low as possible is a very precise process maintenance, in which the underlying coating process is slightly adjusted from coating batch to coating batch, if necessary.

Such process maintenance requires in-depth know-how and can so far only be carried out successfully by well-trained operators or skilled personnel.

In the case of coating of substrates with a layer system, as is typical in the optical industry, for example, process maintenance looks as follows: After an optical substrate has been coated with a layer system, an optical measurement is carried out on at least one coated substrate, in which a spectrally resolved measurement signal is recorded that reproduces the optical system consisting of the optical substrate and the applied layer system. In the case of anti-reflective coatings or mirror coatings, the spectral reflection or reflectivity of the optical system is determined in a commercially available spectrometer. The result is a two-dimensional data set consisting of data tuples (for example, wavelength in nanometres, reflectivity in %). This recorded data set ("installation actual data set") is compared by the operator with a target data set of the same nature, which in the case of anti-reflective coatings or mirror coatings describes the spectral reflection of the target system.

In the case of non-tolerable deviations in the spectral course or the spectral parameters such as the colour values $L^*$, $C^*$, $h^*$ (in the so-called CIELCh colour space), the operator must make a correction to the underlying coating process. As a rule, the operator will adjust the physical layer thickness which is to be deposited, stored in the coating process, of at least one single layer of the layer system. This layer selection is usually based on experience or predefined routines.

After a further coating batch has been produced with this coating process, the operator can determine the effectiveness of his process maintenance by a further comparison between the actual data set and the target data set and can have to make further phenomenological corrections (not numerically generated) to the coating process.

This method is often a time and material consuming iterative trial and error process that can only be performed by knowledgeable operators. This described experience-based procedure will not always lead reliably to the desired result. Furthermore, experience-based process maintenance does not always lead to the same layer thickness relations for the same optical colour values. This can lead to unknowingly changing layer properties and layer thickness relations.

Known optical elements with interferometric anti-reflective coating, such as those known from WO 2016/110339 A1, usually have a light reflectance of about 1%, calculated according to the standard DIN EN ISO 13666:2013-10. The colour of the remaining residual reflection can show a strong variation when the viewing angle is changed. The variation can extend over the entire visual colour scale.

DISCLOSURE OF THE INVENTION

It is the object of the invention to indicate a method for the economically optimised operation of a coating installation for the production of layer systems.

Further objects of the invention are to disclose a coating installation, a coating system, a system of coating installations as well as a database, a computer program product, and a data processing system for executing such a method.

The objects are solved by the features of the independent claims. Favourable designs and advantages of the invention result from the further claims, the description, and the drawing.

The invention is particularly suited for the production of optical elements. It is to be understood that the method according to the invention is not limited to the production of optical elements and coatings, nor to the deposition of multilayer systems. Similarly, the substrate on which the layer system is deposited can or can not be transparent, as required.

Further, the invention can be used for a layer system consisting of a single layer deposited on a substrate and having a layer thickness. This does not preclude that an adhesion promoter layer is arranged between the single layer and the substrate and/or that the single layer is covered with a protective layer. The possible adhesion promoter layer and/or protective layer have no or at least no significant influence on the investigated properties of the layer system with the one single layer.

Alternatively, the layer system can be formed from multiple single layers deposited one on top of the other on a substrate and in which each single layer has a respective layer thickness. The layer thicknesses of the respective single layers can be the same or different. Here, too, an adhesion promoter layer can be arranged between the single layer nearest to the substrate and the substrate and/or the layer system can be covered with a protective layer. The possible adhesion promoter layer and/or protective layer have no or at least no significant influence on the investigated properties of the layer system with the multiple single layers.

Unless otherwise indicated, the terms used in this disclosure are to be understood in the sense of the standard DIN EN ISO 13666:2013-10 (EN ISO 13666:2012 (D/E)) and DIN EN ISO 11664-4:2012-06 (EN ISO 11664-4:2011) of the Deutsches Institut für Normung e.V. of 2012 and 2011, respectively.

According to section 4.2 of the DIN EN ISO 13666:2013-10, the term visible light, visible radiation, or a visible wavelength range relates to optical radiation that is capable of directly causing a sensation of light in humans. Visible radiation generally refers to a wavelength range from 400 nm to 780 nm.

In the context of this disclosure, visible radiation can preferably refer to a wavelength range of 400 nm or 460 nm to 700 nm, corresponding to the sensitivity maximum of the human eye. This can simultaneously increase the design flexibility for the design of the filter properties and of the slew rate.

According to section 15.1 of the standard DIN EN ISO 13666:2013-10, the term spectral reflectance, reflectance or reflectivity, respectively, refers to the ratio of the spectral radiant power reflected by each material or surface or coating, respectively, to the incident radiant power for a specific wavelength ($\lambda$). In the present case, the reflectivity refers to the reflectivity of the entire coating with its multiple high and low refractive index sub-layers and not to the reflectivity of a single sub-layer.

According to a first aspect of the invention, a method is proposed for operating at least one coating installation for the production of layer systems comprising (i) Detecting at least one spectral measurement curve with ordinate values and abscissa values as actual measurement curve on an actual layer system which consists of one or more single layers, each with an installation actual layer thickness of the respective single layer, wherein the one or more single layers are produced according to an installation data set of the at least one coating installation, wherein the installation data set comprises at least the installation actual layer thickness of the respective single layer of the one or more single layers;

(ii) Associating the actual measurement curve of the actual layer system according to at least one association criterion, in particular for significant spectral points of the actual measurement curve, to a target measurement curve of a target data set with ordinate values and abscissa values, which is based on a target data set layer system formed from one or more single layers, wherein the target data set comprises at least one known target layer thickness of the respective single layer of the one or more single layers;

(iii) Generating a simulation actual measurement curve according to an iterative method by varying at least one simulation actual layer thickness of the respective single layers in at least one spectral interval of the actual measurement curve and obtaining a final simulation actual data set with at least one final simulation actual layer thickness of the respective single layer of the one or more single layers, by which the actual measurement curve is at least being approximated in the simulation actual measurement curve until a termination criterion is reached;

(iv) Generating a simulation target measurement curve according to an iterative method by varying at least the simulation target layer thickness of the respective single layer in at least one spectral interval of the target measurement curve and obtaining a final simulation target data set with at least one final simulation target layer thickness of the respective single layer of the one or more single layers, by which the target measurement curve is at least being approximated in the simulation target measurement curve until a termination criterion is reached;
and (v) Providing the final simulation target data set for the at least one coating installation as new installation data set for the deposition of a further layer system with at least one correction actual layer thickness as new installation actual layer thickness of the respective single layer, which are being determined from the final simulation target layer thickness of the respective single layer of the one or more single layers with the final simulation target data set.

Advantageously, the method according to the invention enables a self-controlling and feedback operation of coating installations.

Favourably, the coating installation can be deployed for the production of layer systems such as for optical elements.

The significant points of the curve can advantageously be used to find the matching target design of the coating system to a measurement curve of the examined layer system and then to use it for a first approximation in the form of a horizontal and/or lateral shift of the measurement curve.

The target data set with the target measurement curve contains the target data of the optimal coating. In addition to a spectrally resolved optical measurement, these data can contain further target quantities, such as, for example, in the visible spectral range, the colour values $L^*$, $C^*$, and $h^*$ and/or defined calculable spectral quantities such as averaged or weighted transmission and/or reflection values in an interval to be defined as desired. Examples of spectrally calculable quantities can be the visual range as well as the IR-A/IR-B and/or UV-A/UV-B range.

Furthermore, the target data set contains coating-specific spectral intervals nested from small to large. The largest possible indicated interval represents the maximum spectral viewing range. The number of intervals is freely selectable. The target data set contains characteristic spectral points that unambiguously fix the optical layout of the coating.

The actual measurement curve comprises at least the data of the optical measurement performed. The installation data set comprises at least the actual layer thicknesses of the multiple single layers set at the coating installation if the layer system is formed from multiple single layers, or the actual layer thickness of the one single layer set at the coating installation if the layer system is formed from only one single layer, respectively.

The simulation actual measurement curve comprises at least one simulated spectral measurement curve, which preferably represents a best possible match with the optical measurement performed as actual measurement curve.

The simulation actual data set comprises at least the one simulation actual layer thickness of one of the single layers of the layer system or the simulation actual layer thicknesses of the multiple single layers of the layer system determined in the iterative optimisation method.

The simulation target measurement curve comprises at least one simulated spectral measurement curve, which preferably represents a best possible match between the target measurement curve and the simulation actual measurement curve.

The simulation target data set comprises at least the simulation target layer thicknesses of the multiple single layers determined in the iterative optimisation method or the simulation target layer thickness of the one single layer with the best possible match with the target measurement curve with recalculation via the simulation target data set. The set one or more simulation target layer thicknesses of this data set favourably represent the process parameters for the successive coating batch.

For this purpose, the simulation target data set comprises the set calculation parameters of the simulated layer system for as ideal as possible layers and/or ideal processes, material properties such as ideal as possible refractive indices and as ideal as possible deposition conditions, as well as installation parameters such as coating geometry, coating thickness control, etc. . . .

On the one hand, the simulation target data set correlates the optical differences between the actual measurement curve and the simulation actual measurement curve and at the same time takes into account system-related deviations, such as morphological and technical deviations from coating batch to coating batch, as well as non-system-related deviations, such as handling differences, etc. On the other hand, the simulation actual data set is used for the calculation of the simulation target measurement curve back to the target measurement curve.

With the help of this simulation target data set, there is the possibility of a further analysis of the correlations from installation parameters and layer parameters and/or layer properties. For this purpose, it can be advantageous to have recourse to a statically relevant number of data sets.

The method according to the invention provides that an actual measurement curve of a layer system, which was deposited on the coating installation, is loaded into the simulation software of a simulation computer.

Advantageously, the coating process for a layer system can consist of applying one single layer or multiple single layers. Each single layer is preferably described by a parameter set that contains the physical or optical layer thickness in addition to other parameters such as deposition rate, process gas flows, etc. The one or more single layers of the coating process can consist of the materials $ZrO_2$, $TiO_2$, $Al_2O_3$, $Ta_2O_5$, $Si_3N_4$, $Nd_2O_5$, $Pr_2O_3$, $PrTiO_3$, $La_2O_3$, $Nb_2O_5$, $Y_2O_3$, $Ce_2O_3$, $Dy_2O_5$, $HfO_2$, $SiO_2$, $MgF_2$, $ZrF_4$, $AlF_3$, $Na_3Al_3F_{14}$, $Na_3AlF_6$, silanes and siloxanes as well as any mixtures of these materials. All typical methods like PVD, CVD, sputtering and their related processes can be used as coating methods.

With the help of the simulation software, significant spectral points, for example, such as extreme values of the spectral data, possibly selected points such as 1% passages where the reflection is 1%, a full half width of a peak in the measurement curve or the like are determined from the spectral data of the actual measurement curve according to an association criterion. A comparison is made with the target measurement curves stored in a database on the basis of the determined spectral points in order to find a target measurement curve that matches the actual measurement curve, or to select a target measurement curve for which the deviation from the actual measurement curve is the smallest, respectively. All target measurement curves are loaded from the database into the simulation software and the matching between the characteristic points of the target measurement curve with the respective points of the actual measurement curve is calculated for each target measurement curve.

For all spectral points with the respective coordinates, namely wavelength as abscissa against intensity as ordinate, the quotient of the corresponding abscissa of the actual measurement curve to the abscissa of the target measurement curve as well as the averaged quotient of the determined quotients is formed. These averaged quotients are called scaling factors in the following and apply uniformly to the entire layer system.

For each of these scaling factors, a virtual spectral data set is generated, which results in a first approximation from the layer thickness in case of a single layer, or the layer thicknesses in case of multiple single layers, respectively, of the target measurement curve multiplied by the corresponding scaling factor.

This creates a very favourable starting point for the successive optimisation method. This scaling factor is stored in the database for further possible analyses.

Starting from the scaled preliminary layer thickness of the single layer, or from the scaled preliminary layer thicknesses of the multiple single layers, respectively, of the previous step, an optimisation method starts in a restricted spectral interval. This restricted spectral interval is individual to the coating and stored in the target data set associated to the target measurement curve as the first possible from an interval list of the target data set. Within the scope of this optimisation method, the layer thickness of the single layer, if the layer system is formed from a single layer, or layer thicknesses of the multiple single layers, if the layer system is formed from multiple single layers, respectively, are determined, which describe the actual measurement curve with the underlying simulation target measurement curve in a first approximation.

From the layer thickness or layer thicknesses, respectively, obtained in the previous step as the first simulation actual layer thicknesses, the quotient is formed for the single layer or each of the multiple single layers, respectively, with the corresponding actual layer thickness, or actual layer thicknesses, respectively, that were set on the coating installation. This recalculation results in the first preliminary simulation data set. This first preliminary simulation data set is compared with the target layer thicknesses stored in the target data set for plausibility at single layer level. A deviation of +/−20% per single layer thickness can be acceptable, as it is a first rough approximation. If the deviation is greater, the process is restarted from the previous step, but this time with a constraint in the optimisation method, namely that the single layer thickness for which the single layer thickness was outside the specified range is restricted to this range.

Ideally, this restriction is not necessary. If it is, however, the layer thickness of all single layers can be restricted accordingly.

After this step, a second preliminary set at one layer thickness for a single layer or at multiple layer thicknesses for multiple single layers is available. If no restriction was necessary, this second simulation actual data set is identical to the first preliminary simulation actual data set.

For each further spectral interval from the interval list of the target data set, the optimisation method is now applied. The currently running optimisation method always uses the set of the simulation actual data set of the preceding optimisation method.

Typically, an adapted simplex algorithm can be used as optimisation method, but other known simulation methods can be equally suitable. Simulation software for such optimisation methods is commercially available from various producers, for example the commercial simulation software "Essential MacLeod" or other well-known simulation software for the production of optical coatings, for example.

When all interval iterations have passed, the spectral data approximate the actual measurement curve in good agreement and a first final simulation actual measurement curve is present as well as a corresponding set of simulation actual layer thicknesses. These two parameter sets form the simulation actual data set, which is stored temporarily.

These steps are repeated until a termination criterion is reached, for example until a stable result is obtained according to a statistical selection method. Preferably, the entire curve can be considered for this purpose, in particular e.g. with regard to chi-square deviations and the like.

When the spectral data of the actual measurement curve is approximated in best possible agreement, the final simulation actual data set can be generated with the one or more simulation actual layer thicknesses.

Now the optimisation process is started again, with the difference that now the optimisation between the simulation actual measurement curve and the target measurement curve takes place in order to reproduce the spectral data of the target data set. In addition, the simulation actual data set is now fixed and will no longer be changed.

At the end of this procedure, one, if the layer system is formed with a single layer, or multiple, if the layer system is formed with multiple single layers, simulation target layer thicknesses are available, which generate the simulation target data set. From these one or more simulation target layer thicknesses, the one or more correction actual layer thicknesses are calculated as the next one or more installation actual layer thicknesses by recalculation with the simulation target data set, which are set, or transmitted, respectively, at the coating installation.

Advantages of the invention lie in the fact that, in contrast to the procedure presented in the prior art, with the method according to the invention an overarching analytical controlling of the coating process can take place, which is based entirely on numerical calculations.

Optionally, with the method according to the invention, not only can coating thicknesses be taken into account and corrected, but other process parameters can also be monitored if required, for example the condition of an installation, age and/or condition of coating sources, age and/or condition of measuring equipment in the coating installations, loading condition with substrates during coating and the like.

The method according to the invention can be applied for the automatic self-optimisation of an existing coating process as well as for the automatic self-configuration of new coating processes, such as the running-in of coating installations. By running-in, the skilled person understands the new setting up, or first configuration, respectively, of a new coating process and coating system on a coating installation.

Continuous optimisation/monitoring ensures that the layer systems produced in this way, for example optical elements, have the smallest possible deviation from target data.

In addition, newly introduced parameter sets such as installation data sets and simulation data sets and their monitoring open up new possibilities for the coating and installation monitoring.

Advantageously, the method according to the invention results in possible savings in the manufacture of coating systems, for example for optical elements. An immediate reaction/notification can be made in case of technically caused process deficiencies. For example, in the event of aggregate defects in the coating installation, the following batch can be stopped immediately, thus preventing a faulty batch. In the case of insidious installation or process faults, a misalignment can be prevented by an immediate and continuous coating correction, whereby the installation-specific correction parameter set indicates this.

Maintenance of the coating installation can be simplified. Individual differences in process control by different people can be avoided. Quality assurance on the coating side can take place in this self-controlling system and not downstream as before.

Furthermore, there are advantageous savings opportunities in engineering. The running-in of new processes can be remote controlled from outside. A newly introduced parameter set opens up new ways of understanding previously unsolved installation, process, and layer problems.

In accordance with an advantageous embodiment of the method according to the invention, the termination criterion can be reached when at least one of the following conditions is met:

(i) a stable result is being reached for the association criterion according to a statistical selection method;

(ii) a deviation between the actual measurement curve and the simulation actual measurement curve is within a tolerance range;

(iii) a maximum number of iterations has been performed.

Advantageously, an optimal result can be reached if a stable result is being reached for the association criterion according to a statistical selection method.

If a deviation between the actual measurement curve and the simulation actual measurement curve is within a tolerance range, an at least satisfactory result can be reached.

If a maximum number of iterations has been performed, a computational effort can be limited.

In accordance with an advantageous design of the method according to the invention, the target layer thickness of the respective single layer can be used as starting value of the simulation actual layer thickness. This gives good results of the method. Alternatively or additionally, the simulation actual layer thickness of the respective single layer can be used as starting value of the simulation target layer thickness of the respective single layer. Especially in combination with the target layer thickness as the starting value of the simulation actual layer thickness of the respective single layer, the results of the method can be further improved.

Alternatively or additionally, a predetermined layer thickness of the respective single layer can be used as starting value of the simulation target layer thickness of the respective single layer. This is favourable if, for example, empirical values for a favourable layer thickness are already present, or, if multiple single layers are to be deposited, empirical values for favourable layer thicknesses of the single layers are already available. Furthermore, with an almost arbitrary starting value of the layer thicknesses of the single layers, a sufficiently good result for a layer system can be achieved by a correspondingly larger number of iterations.

In accordance with an advantageous design of the method according to the invention, the generating of the simulation actual measurement curve, or simulation target measurement curve, respectively, can further comprise:

Determining a scaling factor as mean value of quotients of abscissa values of the actual measurement curve, or simulation actual measurement curve, respectively, and the target measurement curve for abscissa values determined according to the association criterion, and scaling the one target layer thickness, if the layer system is formed from a single layer, or the multiple target layer thicknesses, if the layer system is formed from multiple single layers; or the one or more simulation actual layer thicknesses of the one or more single layers, respectively, with the scaling factor as starting values of the one or more simulation actual layer thicknesses, or one or more simulation target layer thicknesses, respectively.

Accordingly, according to the method according to the invention, the simulation actual measurement curve is being generated from the actual measurement curve and the target layer thicknesses in order to determine starting values for the simulation actual layer thicknesses, while the simulation target measurement curve is being generated from the simulation actual measurement curve and the simulation actual layer thicknesses in order to determine starting values for the simulation target layer thicknesses.

This creates the best possible starting point for the successive optimisation method.

In accordance with an advantageous embodiment of the method according to the invention, the generating of the simulation actual measurement curve, or simulation target measurement curve, respectively, can further comprise:

at least for the first interval for each of the multiple single layers, if the layer system has multiple single layers, or for the one single layer, if the layer system has only one single layer: forming a quotient of the corresponding first final simulation actual layer thickness, or the corresponding first final simulation target layer thickness, respectively, and the corresponding installation actual layer thickness, wherein first simulation actual layer thicknesses, or simulation target layer thicknesses, respectively, are being generated by scaling the simulation actual layer thicknesses, or simulation target layer thicknesses, respectively, with the quotient.

Accordingly, for the generating of the simulation actual measurement curve, the simulation actual layer thicknesses are used, while for the generating of the simulation target measurement curve, the simulation target layer thicknesses are used.

In this way, favourable starting values can be generated in a suitable manner for further optimisation when adjusting simulation actual measurement curves, or simulation target measurement curves, respectively.

In accordance with an advantageous embodiment of the method according to the invention, the generating of the simulation actual measurement curve, or simulation target measurement curve, respectively, can further comprise:

Verifying the single first one simulation actual layer thickness or multiple simulation actual layer thicknesses, or the one simulation target layer thickness, respectively, of the respective single layer for at least one criterion, in particular a plausibility and/or a predetermined deviation from the respective target layer thickness of the target measurement curve, and, if the at least one criterion is being missed, Repeating the varying of the simulation actual layer thickness of the respective single layer, or the simulation target layer thickness, respectively, of the respective single layer and the providing of a first final simulation actual layer thickness, or simulation target layer thickness, respectively, of the respective single layer, as well as the generating of the first simulation actual layer thickness, or simulation target layer thickness, respectively, of the respective single layer of the one or more single layers, wherein for the one single layer or for those of the multiple single layers which have failed the criterion a restriction is specified when varying, and Providing a second simulation actual layer thickness, or simulation target layer thickness, respectively, of the respective single layer of the one or more single layers.

Accordingly, for the generating of the simulation actual measurement curve, the simulation actual layer thicknesses are used, while for the generating of the simulation target measurement curve, the simulation target layer thicknesses are used.

This procedure facilitates the narrowing down of the parameters in the optimisation method and thus accelerates the determining of the optimised parameter sets.

In accordance with an advantageous design, the method according to the invention can further comprise:

Repeating the steps in one or more further spectral intervals, wherein each successive interval includes the preceding interval, wherein the second simulation actual layer thickness, or simulation target layer thickness, respectively, of the respective single layer of the preceding interval are being set as starting values in the successive interval, and Providing a final simulation actual layer thickness or simulation target layer thickness, respectively, of the respective single layer of the one or more single layers.

Accordingly, iterative interval nestings are each performed separately for simulation actual layer thicknesses and simulation target layer thicknesses.

In this way, an effective approximation of the simulation measurement curves to the measured actual measurement curves can advantageously be achieved, whereby the fitting parameters thus can be successively refined. The risk that an unfavourable minimum is determined in the optimisation process can be reduced this way.

In accordance with an advantageous design of the method according to the invention, an optical element can be produced, wherein the optical element comprises a substrate and an interferometric reflection-reducing layer system on at least one surface of the substrate, wherein the layer system comprises a stack of at least four successive layer packets, wherein each layer packet comprises a pair of first and second single layers, wherein the first single layers have a first optical thickness and the second single layers have a second optical thickness different from the first optical thickness, wherein a refractive index of the respective first single layers nearer to the substrate is greater than a refractive index of the respective second single layers further away from the substrate of the stack, wherein the layer system has a lightness, a chroma, and a hue angle of a residual reflection colour, wherein the value of a change in the hue angle of the residual reflection colour in an interval of a viewing angle with the boundary values of 0° and 30°, relative to a surface normal onto the layer system, is smaller than the value of a change in the chroma in the interval of the viewing angle, wherein the following steps are being carried out:
defining a layer design, comprising at least a first material for high refractive index first single layers and a second material for low refractive index second single layers, number of desired layer packets with the single layers, starting values of the thickness of the single layers;
defining target colour values comprising lightness, chroma, and hue angle at least at boundary values for an interval of a viewing angle with boundary values of 0° and 30°;
performing an optimisation method for varying the single layer thicknesses until an optimisation target is reached.

Advantageously, the target colour values at the boundary values of the interval can be chosen to be the same or similar.

In particular, maximum deviations for the hue angles of different residual reflection colours can be predetermined.

Advantageously, the layer system can have four or five layer packets, more than five layer packets can also be provided.

The chroma can also be referred to as colour saturation. The hue angle can also be referred to as colour angle.

Advantageously, by varying the layer thicknesses of the sub-layers, a colour-stable layer system can be provided whose residual reflection colour does not change or changes only slightly even with a larger change in the viewing angle. Advantageously, a colour-stable residual reflection colour can be achieved by a suitable combination of chroma and hue angle over a large viewing angle range.

The first, nearer to the substrate, sub-layers of the layer packets in the stack can be formed from the same first material. The second, further away from the substrate, sub-layers can also be formed from the same second material which differs from the first material of the first sub-layers. It can be provided for that a functional layer of a third material, which has comparable refractive properties to the second sub-layer, is arranged in the layer packet furthest away from the substrate between the first and second sub-layer. For calculation purposes, the functional layer can be associated with the second sub-layer, if necessary. Alternatively, the materials of the first sub-layers can vary in the stack. Likewise, it can alternatively be provided for that the materials from which the second sub-layers are formed vary in the stack.

In accordance with an advantageous embodiment of the method according to the invention, the hue angle in the interval of the viewing angle with the boundary values 0° and 30° can change by at most 15°, preferably by at most 10°; and/or the value of change in the hue angle in a second interval of a viewing angle from 0° to a boundary viewing angle with an upper boundary value between 30° and 45°, relative to the surface normal onto the layer system, can be smaller than the value of a change in the chroma in the second interval of the viewing angle, and the value of the chroma at the boundary viewing angle can be at least 2, in particular wherein the hue angle in the second interval can change by at most 20°, preferably by at most 15°; and/or the photopic reflectance in the interval of the viewing angle with the boundary values 0° and 30° can be at most 1.5%, preferably at most 1.2%; and/or the scotopic reflectance in the interval of the viewing angle with the boundary values 0° and 30° can be at most 1.5%, preferably at most 1.2%.

The colour impression of the residual reflection of the optical system remains completely or almost unchanged for an observer.

Advantageously, a colour-stable residual reflection colour results even with larger variation of the viewing angle.

Advantageously, the first sub-layers can be formed from a high refractive index material.

Favourably, the first sub-layers can have at least one or more of the compounds $Ta_2O_5$, $TiO_2$, $ZrO_2$, $Al_2O_3$, $Nd_2O_5$, $Pr_2O_3$, $PrTiO_3$, $La_2O_3$, $Nb_2O_5$, $Y_2O_3$, $HfO_2$, InSn oxide, $Si_3N_4$, MgO, $CeO_2$, ZnS and/or their modifications, in particular their other oxidation states and/or mixtures thereof with silanes and/or siloxanes.

These materials are known as high classical refractive index materials for deployment in optical elements, such as for coating spectacle lenses. However, the higher refractive index sub-layers can also contain $SiO_2$ or other lower refractive index materials as long as the refractive index of the entire sub-layer is greater than 1.6, preferably at least 1.7, more preferably at least 1.8, most preferably at least 1.9.

Advantageously, the second sub-layers can be formed from a low refractive index material.

The lower-refractive index sub-layers can have at least one of the materials $MgF_2$, SiO, $SiO_2$, $SiO_2$ with additions of Al, silanes, siloxanes in pure form or with their fluorinated derivatives. However, the lower refractive index sub-layers can also contain a mixture of $SiO_2$ and $Al_2O_3$. Preferably, the lower refractive index sub-layers can contain at least 80% by weight of $SiO_2$, more preferably at least 90% by weight of $SiO_2$.

Preferably, the refractive index of the low refractive index sub-layers is at most 1.55, preferably at most 1.48, particularly preferably at most 1.4. These indications of refractive indices refer to normal conditions at a temperature of 25° C. as well as a reference wavelength of the light intensity used of 550 nm.

Typical examples of layer materials with different refractive indices are silicon dioxide ($SiO_2$) with a refractive index of 1.46, aluminium oxide ($Al_2O_3$) with a refractive index of 1.7, zirconium dioxide ($ZrO_2$) with a refractive index of 2.05, praseodymium titanium oxide ($PrTiO_3$) with a refractive index of 2.1, titanium oxide ($TiO_2$) and zinc sulphide (ZnS) each with a refractive index of 2.3. These values represent average values that can vary by up to 10% depending on coating method and layer thickness.

Common optical glasses have refractive indices between 1.5 and 2.0. Layer materials with refractive indices smaller than 1.5, such as $MgF_2$, $SiO_2$, are therefore referred to as low refractive index materials in combination with optical glasses, while layer materials with refractive indices larger than 2.0, such as $ZrO_2$, $PrTiO_3$, $TiO_2$, ZnS, are referred to as high refractive index materials in combination with optical glasses.

The difference in refractive indices between the high refractive and low refractive materials of the first and second sub-layers is preferably at least 0.2 to at least 0.5, depending on the coating method and layer thickness.

The materials used for this type of coatings are the typical materials applied to a substrate in optics by means of, for example, PVD-methods (PVD=physical vapour deposition) or CVD-methods (CVD=chemical vapour deposition).

According to a favourable embodiment of the optical element, at least the first sub-layers can be formed from a same first material and the second sub-layers can be formed at least predominantly from a same second material.

Optionally, the second sub-layers can be formed from the same second material and have a functional layer between the first sub-layer and the second sub-layer only in the layer packet furthest away from the substrate. The functional layer can have a low refractive index and can be added to the second sub-layer for calculation purposes, if required.

According to another, in particular independent, aspect of the invention, a method for the production of a layer system from one single layer or multiple single layers in at least one coating installation is provided, comprising:

(i) Detecting at least one spectral measurement curve with ordinate values and abscissa values as actual measurement curve on an actual layer system which consists of one or more single layers, each with an installation actual layer thickness of the respective single layer, wherein the one or more single layers are produced according to an installation data set of the at least one coating installation, wherein the installation data set comprises at least the installation actual layer thickness of the respective single layer of the one or more single layers;

(ii) Associating the actual measurement curve of the actual layer system according to at least one association criterion, in particular for significant spectral points of the actual measurement curve, to a target measurement curve of a target data set with ordinate values and abscissa values, which is based on a target data set layer system formed from one or more single layers, wherein the target data set comprises at least one known target layer thickness of the respective single layer of the one or more single layers;

(iii) Generating a simulation actual measurement curve according to an iterative method by varying at least one simulation actual layer thickness of the respective single layer in at least one spectral interval of the actual measurement curve and obtaining a final simulation actual data set with at least one final simulation actual layer thickness of the respective single layer of the one or more single layers, by which the actual measurement curve is at least being approximated in the simulation actual measurement curve until a termination criterion is reached, (iv) Generating a simulation target measurement curve according to an iterative method by varying at least the simulation target layer thickness of the respective single layer in at least one spectral interval of the target measurement curve and obtaining a final simulation target data set with at least one final simulation target layer thickness of the respective single layer of the one or more single layers, by which the target measurement curve is at least being approximated in the simulation target measurement curve until a termination criterion is reached;

(v) Providing the final simulation target data set for the at least one coating installation as new installation data set for the deposition of a further layer system with at least one correction actual layer thickness as new installation actual layer thickness of the respective single layer, which are being determined from the final simulation target layer thickness of the respective single layer of the one or more single layers with the final simulation target data set.

Advantageously, the iterative method can be performed for one or more spectral intervals, wherein each successive interval includes the preceding interval.

Single steps of the method described above for operating a coating installation for the production of a layer system, for example for an optical element, can thus advantageously be applied to the production of the layer system itself.

Advantageously, using the method according to the first aspect of the invention, the method enables a self-controlling and feedback operation of coating installations for layer systems, in particular for optical layer systems.

According to another, in particular independent, aspect of the invention, a method is proposed for running-in a coating process in at least one coating installation for the production of a layer system, wherein an actual measurement curve of a spectral measurement curve with ordinate values and abscissa values is at least being approximated in a simulation actual measurement curve until a termination criterion is reached, comprising:

(i) Detecting at least one spectral measurement curve with ordinate values and abscissa values as actual measurement curve at an actual layer system which consists of one or more single layers, each with an installation actual layer thickness of the respective single layer, wherein the one or more single layers are produced according to an installation data set of the at least one coating installation, wherein the installation data set comprises at least the installation actual layer thickness of the respective single layer of the one or more single layers;

(ii) Associating the actual measurement curve of the actual layer system according to at least one association criterion, in particular for significant spectral points of the actual measurement curve, to a target measurement curve of a target data set with ordinate values and abscissa values, which is based on a target data set layer system formed from one or more single layers, wherein the target data set comprises at least one known target layer thickness of the respective single layer of the one or more single layers;

(iii) Generating a simulation actual measurement curve according to an iterative method by varying at least one simulation actual layer thickness of the respective single layer in at least one spectral interval of the actual measurement curve and obtaining a final simulation actual data set with at least one final simulation actual layer thickness of the respective single layer of the one or more single layers, by which the actual measurement curve is at least being approximated in the simulation actual measurement curve until a termination criterion is reached, (iv) Generating a simulation target measurement curve according to an iterative method by varying at least the simulation target layer thickness of the respective single layer in at least one spectral interval of the target measurement curve and obtaining a final simulation target data set with at least one final simulation target layer thickness of the respective single layer of the one or more single layers, by which the target measurement curve is at least being approximated in the simulation target measurement curve until a termination criterion is reached;

(v) Providing the final simulation target data set for the at least one coating installation as new installation data set for the deposition of a further layer system with at least one correction actual layer thickness as new installation actual layer thickness of the respective single layer, which are being determined from the final simulation target layer thickness of the respective single layer of the one or more single layers with the final simulation target data set.

Advantageously, using the method according to the first aspect of the invention, the method enables a self-controlling and feedback mode of operation when running-in coating processes in coating installations.

Usually, the running-in of coating installations requires a considerable amount of time, which can advantageously be shortened.

The running-in of a new coating installation can be performed more effectively and faster with the self-controlling and feedback method according to the invention for operating a coating installation for the production of a layer system, for example for an optical element. This results in considerable savings potential during commissioning of the coating installation. Also, the running-in of the coating installation can even be remote controlled, which results in further savings potential due to fewer operating personnel required on site.

According to a further, in particular independent, aspect of the invention, a coating system for the production of a layer system, for example for an optical element, is proposed, comprising at least a coating installation for coating a substrate with a layer system;

a control computer for controlling the coating installation and for communicating with a simulation computer;

an optical measurement device for determining a spectrally resolved actual measurement curve of the layer system;

a simulation computer on which simulation software for optical calculation and optimisation of the layer system is installed;

a database for storing installation data sets;

an input device for inputting and controlling the simulation computer and/or the coating installation.

In this way, the coating system comprises all the necessary components required for an effective running-in and operating of the coating installation according to the method according to the invention as described above.

As a result, the running-in of a new coating installation with the method according to the invention for operating a coating installation for the production of a coating system can be performed more effectively and faster. This results in considerable savings potential when commissioning the coating installation. Also, the running-in of the coating installation can even be remote controlled, which results in further savings potential due to fewer operating personnel required on site.

The coating installation comprises, for example, a vacuum chamber with associated aggregates for the coating of substrates, such as various coating sources, apertures, glass holders, pumps, etc.

Advantageously, using the method according to the first aspect of the invention, the coating system can be operable in a self-controlled and feedback manner.

The control computer of the coating system controls the coating process on the coating installation and handles the communication with the coating installation. For automatic data exchange, this computer can have at least a network connection.

In the optical measurement device, a spectrally resolved measurement signal can be recorded, which reproduces the optical element consisting of the optical substrate and the applied layer system. This so-called actual measurement curve can be provided as a two-dimensional data set consisting of data tuples, for example as wavelength in nanometres, reflectivity in %. This data is referred to as "spectral data".

The simulation software is installed on the simulation computer.

The simulation software is a computer program that can at least read in the data set generated by the optical measurement device. Further, the simulation software can read in and output data sets of the coating installation.

The software implements the described method according to the invention as control algorithm. The software works with the database and reads out, for example, target data sets from the database, stores newly calculated simulation data sets in the database. Further, the software implements at least one arbitrary optimisation/fitting algorithm as found in commercially available simulation programs, for example in "Essential MacLeod".

In the database, the simulation target data sets obtained are stored for each coating installation and for each coating process and can be read out again at a later time instant. In addition, the database contains the corresponding target data sets for all stored coating processes.

The bidirectional data exchange between the control computer of the coating installation and the simulation software can either be realised directly by the simulation software and an existing network connection to the control computer of the coating installation or further software can be used which takes over the data exchange and provides the simulation software with data from the coating installation and transfers data back to the coating installation in the opposite direction. In the manual case, this data exchange takes place through interaction with an operator via an input device.

According to a further, in particular independent, aspect of the invention, a coating installation for the production of a layer system, for example for an optical element, is proposed, in particular as described above, comprising a component for the application of an artificial ageing process to the layer system.

Expediently, the layer system produced in the coating installation can also be artificially aged in the same installation in order to obtain a stationary actual measurement curve when determining the spectral properties of the layer system. This results in a high degree of certainty in determining the correct correction layer thicknesses for the new layer systems since the properties of the layer systems do not change much over time anymore.

Advantageously, using the method according to the first aspect of the invention, the method enables a self-controlling and feedback operation of coating installations.

According to a further, in particular independent, aspect of the invention, a coating installation for the production of a layer system, for example for an optical element, is proposed, in particular as described above, comprising an optical measurement device for determining a spectrally resolved actual measurement curve of the coating system and/or a component for the application of an artificial ageing process to the layer system.

Favourably, an optical measurement device for the in-situ determination of the spectral data of the produced layer system can also be arranged in the coating installation itself. This eliminates uncertainties during transfer of the coating system from the coating installation and possible subsequent changes to the layer system. Thus, the determination of suitable one (in the case of a layer system with a single layer) or more (in the case of a layer system with multiple single layers) correction layer thicknesses can be carried out more directly. An optimisation of the installation data sets for the coating method can thus be carried out more effectively.

Advantageously, a component for artificial ageing of the produced layer system can also be integrated into the coating installation. The layer system produced in the coating installation can thus expediently be artificially aged in the same installation in order to obtain a stationary actual measurement curve when determining the spectral properties of the optical element.

This results in a high degree of certainty when determining the correct one or more corrective coating thicknesses for the new layer systems since the properties of the layer systems do not change much over time anymore.

Advantageously, using the method according to the first aspect of the invention, the coating system can be operable in a self-controlled and feedback manner.

According to a further, in particular independent, aspect of the invention, a system of coating installations for the production of layer systems, for example for optical elements, is proposed, in particular as described above, comprising at least one or more coating installations for coating at least one substrate with a layer system;

one or more control computers for controlling at least one coating installation and for communicating with a simulation computer, an optical measurement device for determining a spectrally resolved actual measurement curve of the layer system;

a simulation computer on which simulation software for optical calculation and optimisation of the layer system is installed, and which communicates with the control computer of the coating installation;

a database for storing installation data sets; and an input device for inputting and controlling the simulation computer and/or the one or more coating installations.

In such a system of multiple coating installations, the various coating installations can be controlled by one simulation computer, which results in considerable savings potential when operating the coating installations. In this way, knowledge and/or data sets which are being obtained at one coating installation can also be effectively transferred to another coating installation.

According to a further, in particular independent, aspect of the invention, a database is proposed for storing installation data sets, for a method for operating at least one coating installation for the production of layer systems, for example for optical elements, in particular a method according to the first aspect of the invention, comprising (i) detecting at least one spectral measurement curve with ordinate values and abscissa values as actual measurement curve on an actual layer system which consists of one or more single layers, each with an installation actual layer thickness of the respective single layer, wherein the one or more single layers are produced according to an installation data set of the at least one coating installation, wherein the installation data set comprises at least the installation actual layer thickness of the respective single layer of the one or more single layers;

(ii) Associating the actual measurement curve of the actual layer system according to at least one association criterion, in particular for significant spectral points of the actual measurement curve, to a target measurement curve of a target data set with ordinate values and abscissa values, which is based on a target data set layer system formed from one or more single layers, wherein the target data set comprises at least one known target layer thickness of the respective single layer of the one or more single layers;

(iii) Generating a simulation actual measurement curve according to an iterative method by varying at least one simulation actual layer thickness of the respective single layer in at least one spectral interval of the actual measurement curve and obtaining a final simulation actual data set with at least one final simulation actual layer thickness of the respective single layer of the one or more single layers, by which the actual measurement curve is at least being approximated in the simulation actual measurement curve until a termination criterion is reached, (iv) Generating a simulation target measurement curve according to an iterative method by varying at least the simulation target layer thickness of the respective single layer in at least one spectral interval of the target measurement curve and obtaining a final simulation target data set with at least one final simulation target layer thickness of the respective single layer of the one or more single layers, by which the target measurement curve is at least being approximated in the simulation target measurement curve until a termination criterion is reached;

(v) Providing the final simulation target data set for the at least one coating installation as new installation data set for the deposition of a further layer system with at least one correction actual layer thickness as new installation actual layer thickness of the respective single layer, which are being determined from the final simulation target layer thickness of the respective single layer of the one or more single layers with the final simulation target data set.

The installation data sets comprise at least installation data sets, target data sets, simulation actual data sets, and/or simulation target data sets.

With the aid of such a database, a wide variety of installation data sets, target data sets, simulation actual data sets and/or simulation target data sets can be accessed in an effective manner. In this way, findings from previous and/or other coating processes can be used further in a favourable manner or transferred to other coating installations and/or processes.

Advantageously, by means of the database using the method according to the first aspect of the invention, a coating installation or a system of coating installations can be operated in a self-controlling and feedback manner.

According to a further, in particular independent, aspect of the invention, a computer program product is proposed for a method for operating at least one coating installation for the production of layer systems, for example for optical elements, wherein the computer program product comprises at least one computer-readable storage medium which comprises program instructions which are executable on a computer system and cause the computer system to execute a method comprising (i) Detecting at least one spectral measurement curve with ordinate values and abscissa values as actual measurement curve on an actual layer system which consists of one or more single layers, each with an installation actual layer thickness of the respective single layer, wherein the one or more single layers are produced according to an installation data set of the at least one coating installation, wherein the installation data set comprises at least the installation actual layer thickness of the respective single layer of the one or more single layers;

(ii) Associating the actual measurement curve of the actual layer system according to at least one association criterion, in particular for significant spectral points of the actual measurement curve, to a target measurement curve of a target data set with ordinate values and abscissa values, which is based on a target data set layer system formed from one or more single layers, wherein the target data set comprises at least one known target layer thickness of the respective single layer of the one or more single layers;

(iii) Generating a simulation actual measurement curve according to an iterative method by varying at least one simulation actual layer thickness of the respective single layer in at least one spectral interval of the actual measurement curve and obtaining a final simulation actual data set with at least one final simulation actual layer thickness of the respective single layer of the one or more single layers, by which the actual measurement curve is at least being approximated in the simulation actual measurement curve until a termination criterion is reached, (iv) Generating a simulation target measurement curve according to an iterative method by varying at least the simulation target layer thickness of the respective single layer in at least one spectral interval of the target measurement curve and obtaining a final simulation target data set with at least one final simulation target layer thickness of the respective single layer of the one or more single layers, by which the target measurement curve is at least being approximated in the simulation target measurement curve until a termination criterion is reached;

(v) Providing the final simulation target data set for the at least one coating system as new installation data set for the deposition of a further layer system with at least one correction actual layer thickness as new installation actual layer thickness of the respective single layer, which are being determined from the final simulation target layer thickness of the respective single layer of the one or more single layers with the final simulation target data set.

The computer program product can provide the software for controlling and operating coating installations in a modular manner and make it accessible for a wide variety of data processing systems.

Advantageously, by means of the computer program product using the method according to the first aspect of the invention, a coating installation or a system of coating installations can be operated in a self-controlling and feedback manner.

According to a further, in particular independent, aspect of the invention, a data processing system for the execution of a data processing program comprising computer-readable program instructions is proposed to execute a method for operating at least one coating installation for the production of coating systems, for example for optical elements, in particular as described above. The data processing system can favourably comprise the simulation computer and the database, but also the control computer of the coating installation.

Advantageously, by means of the data processing system using the method according to the first aspect of the invention, a coating installation or a system of coating installations can be operated in a self-controlling and feedback manner.

DRAWING

Further advantages will be apparent from the following description of the drawing. In the figures, example embodiments of the invention are depicted. The figures, the description, and the claims contain numerous features in combination. The person skilled in the art will expediently also consider the features individually and combine them to form useful further combinations.

Figure 2:
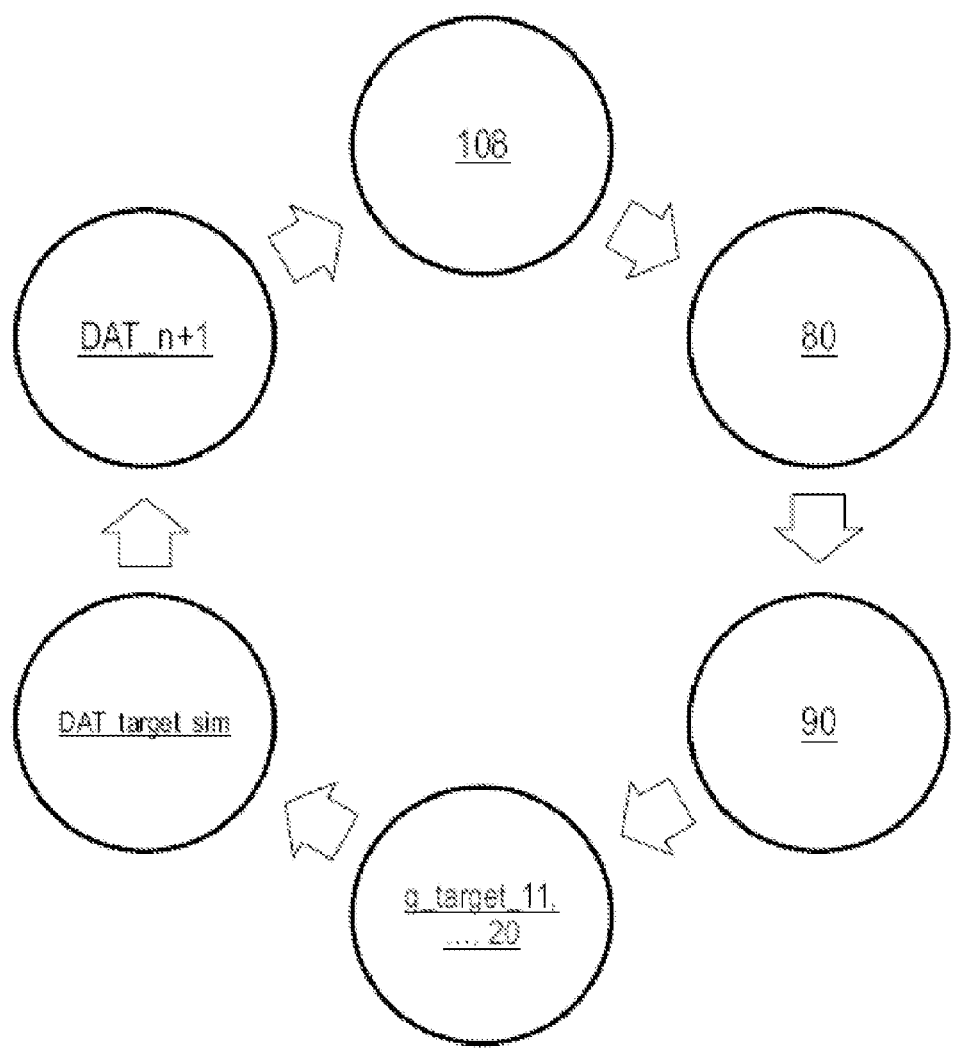
Figure 3:
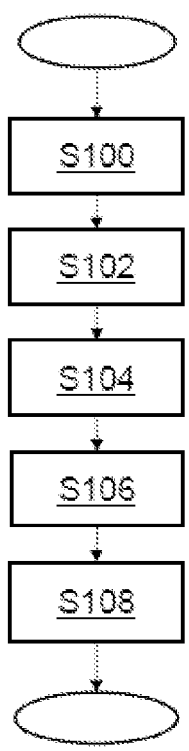
Figure 4:
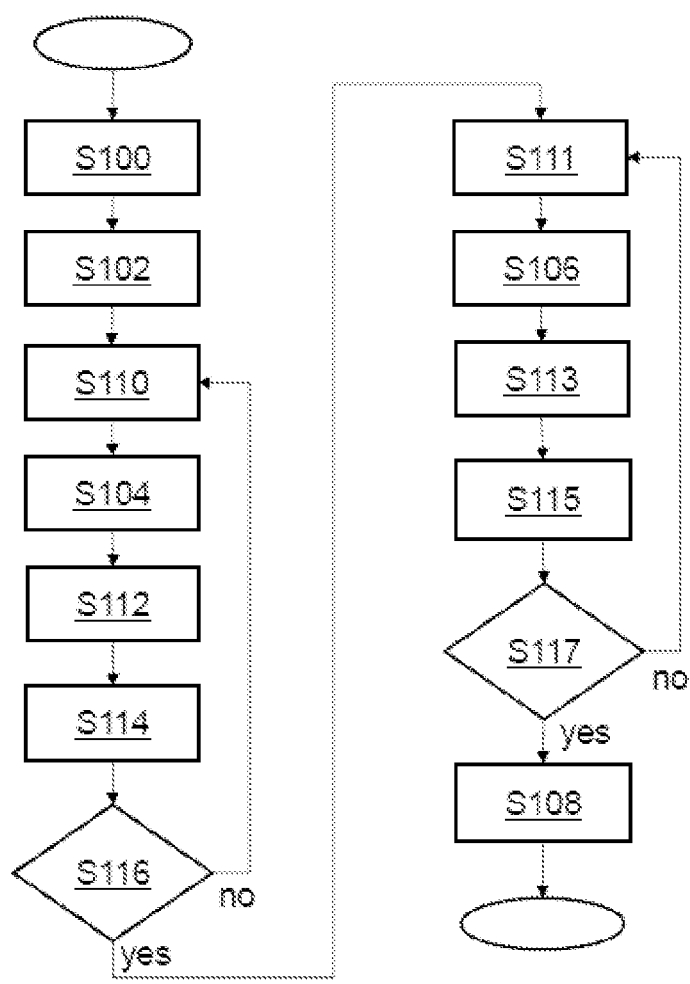
Figure 5:
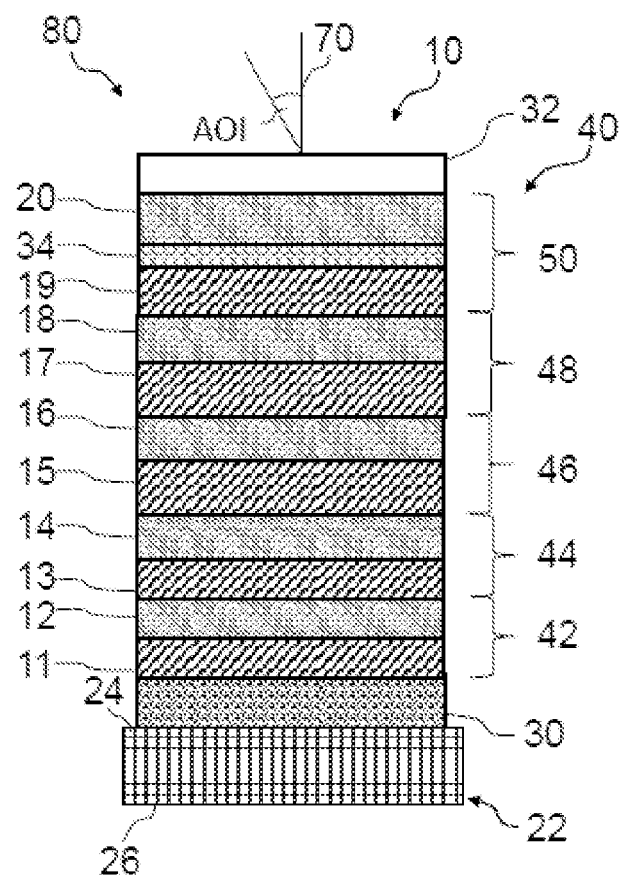
Figure 6:
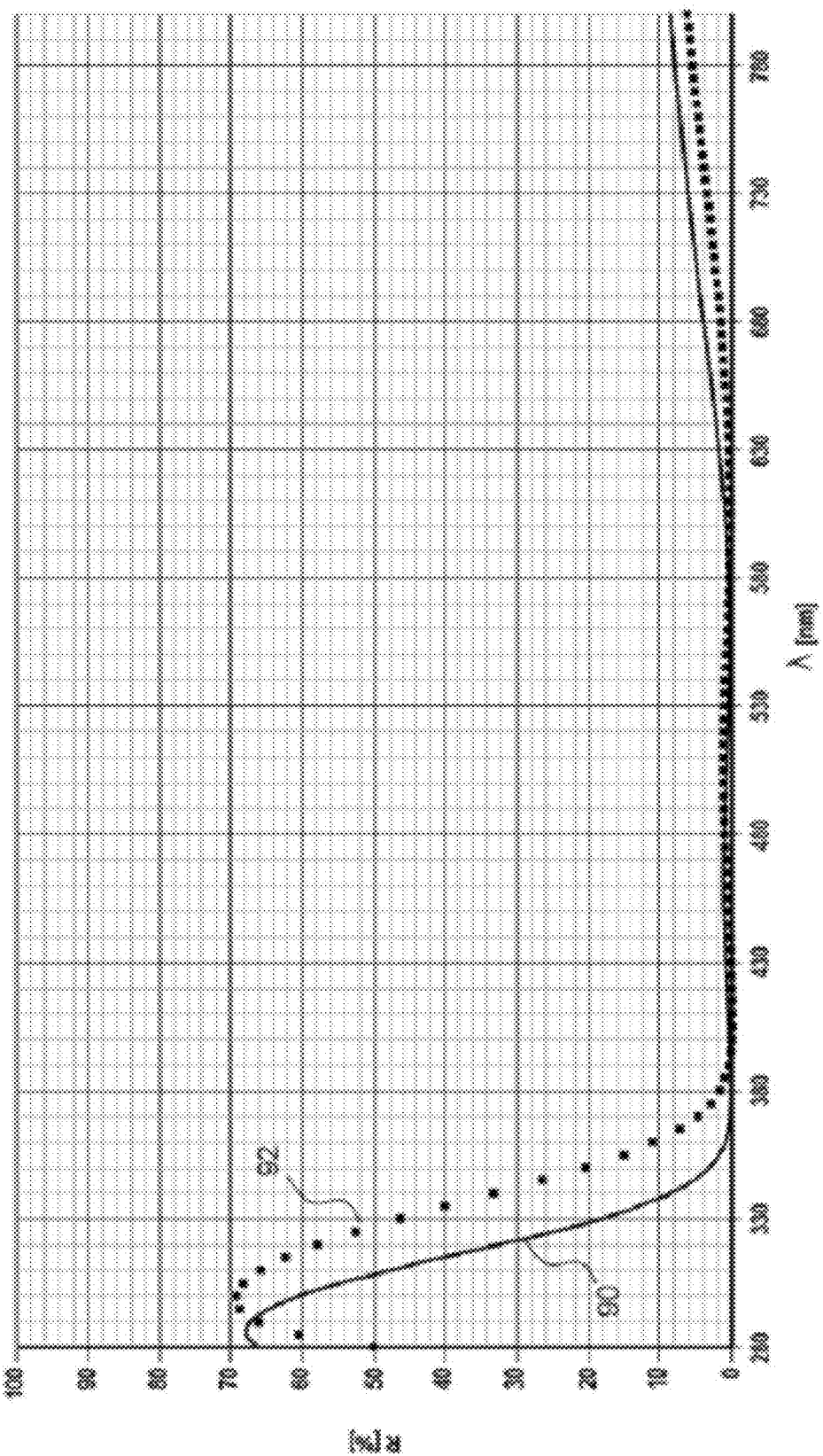
Figure 7:
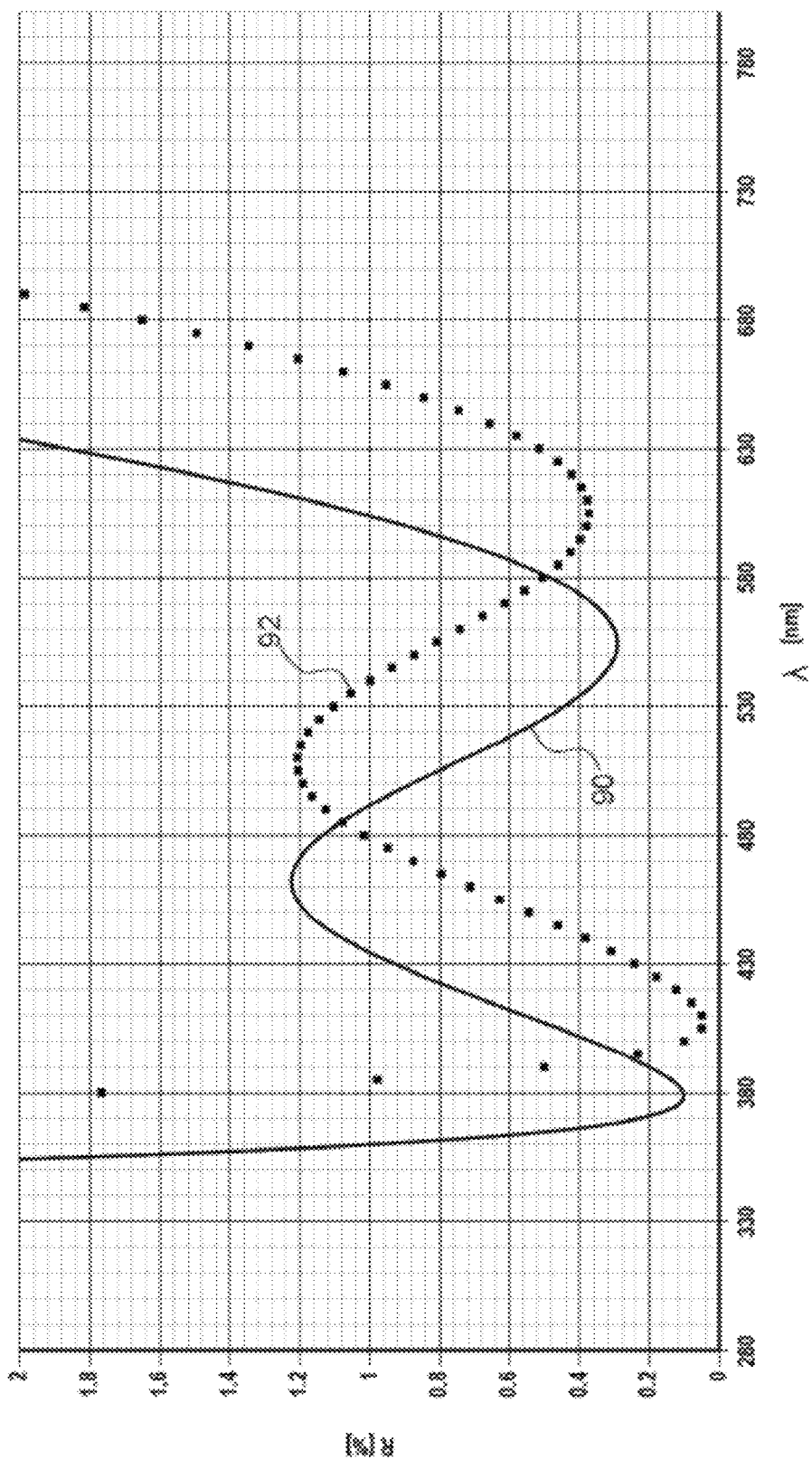
Figure 8:
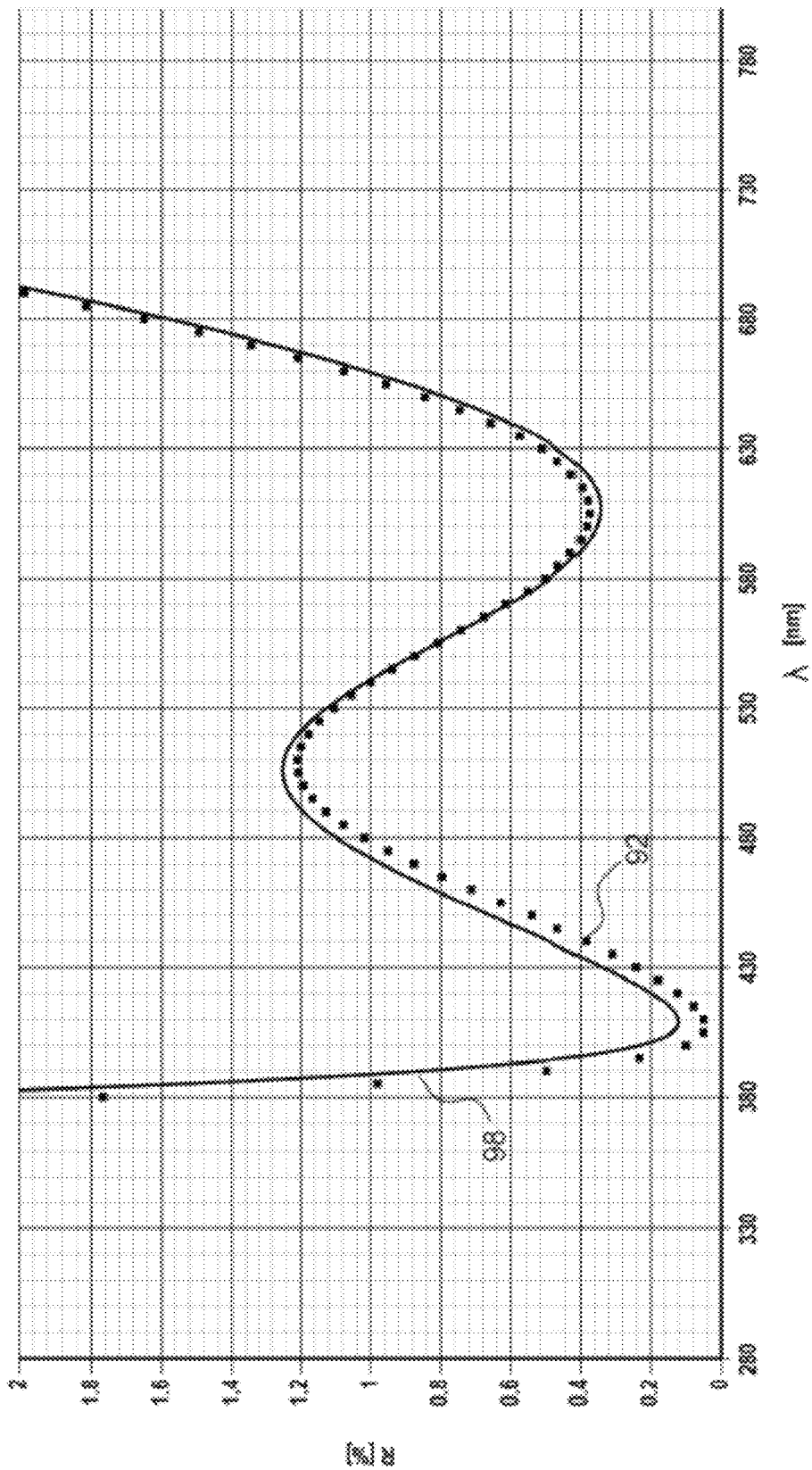
Figure 9:
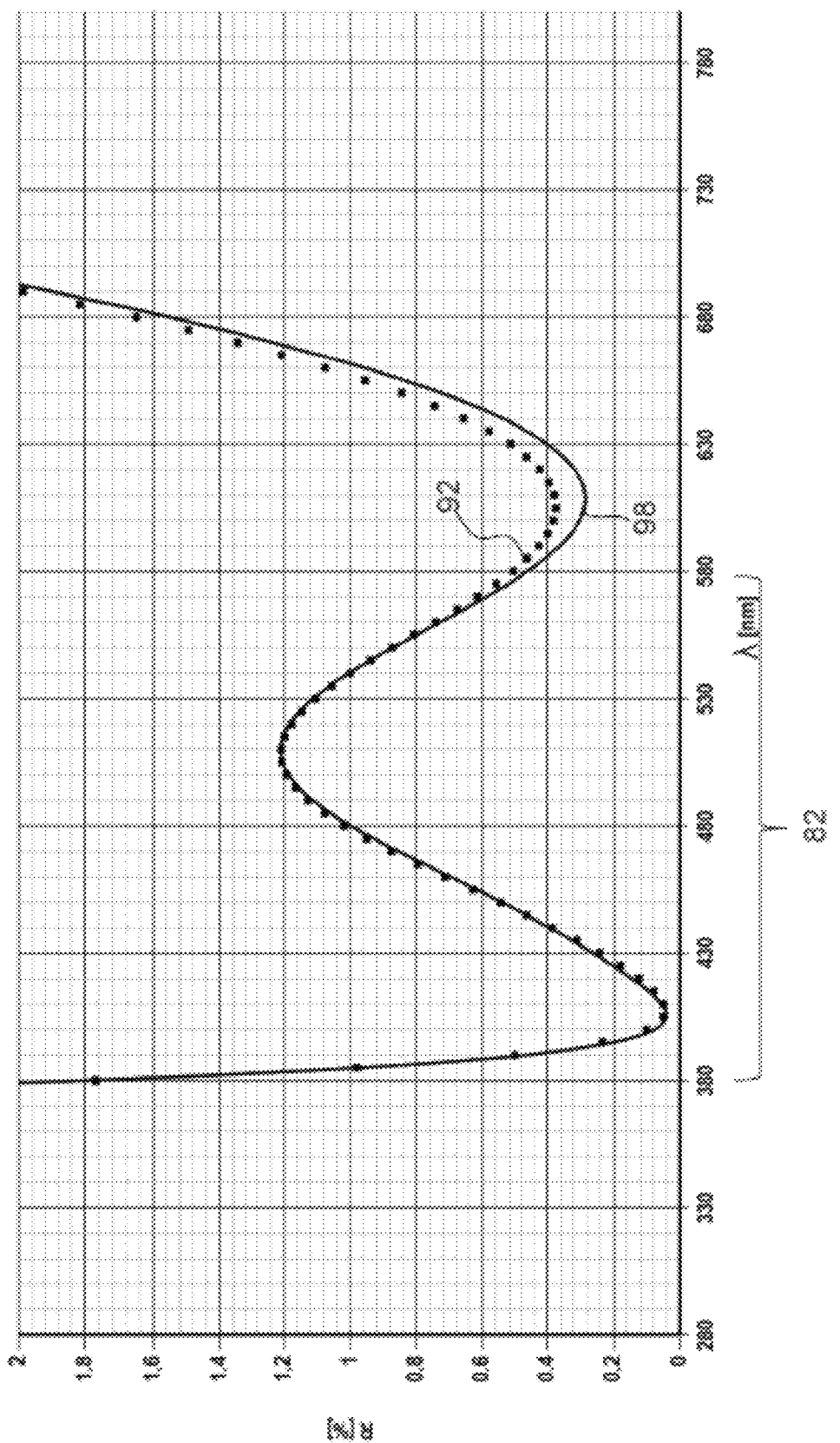
Figure 10:
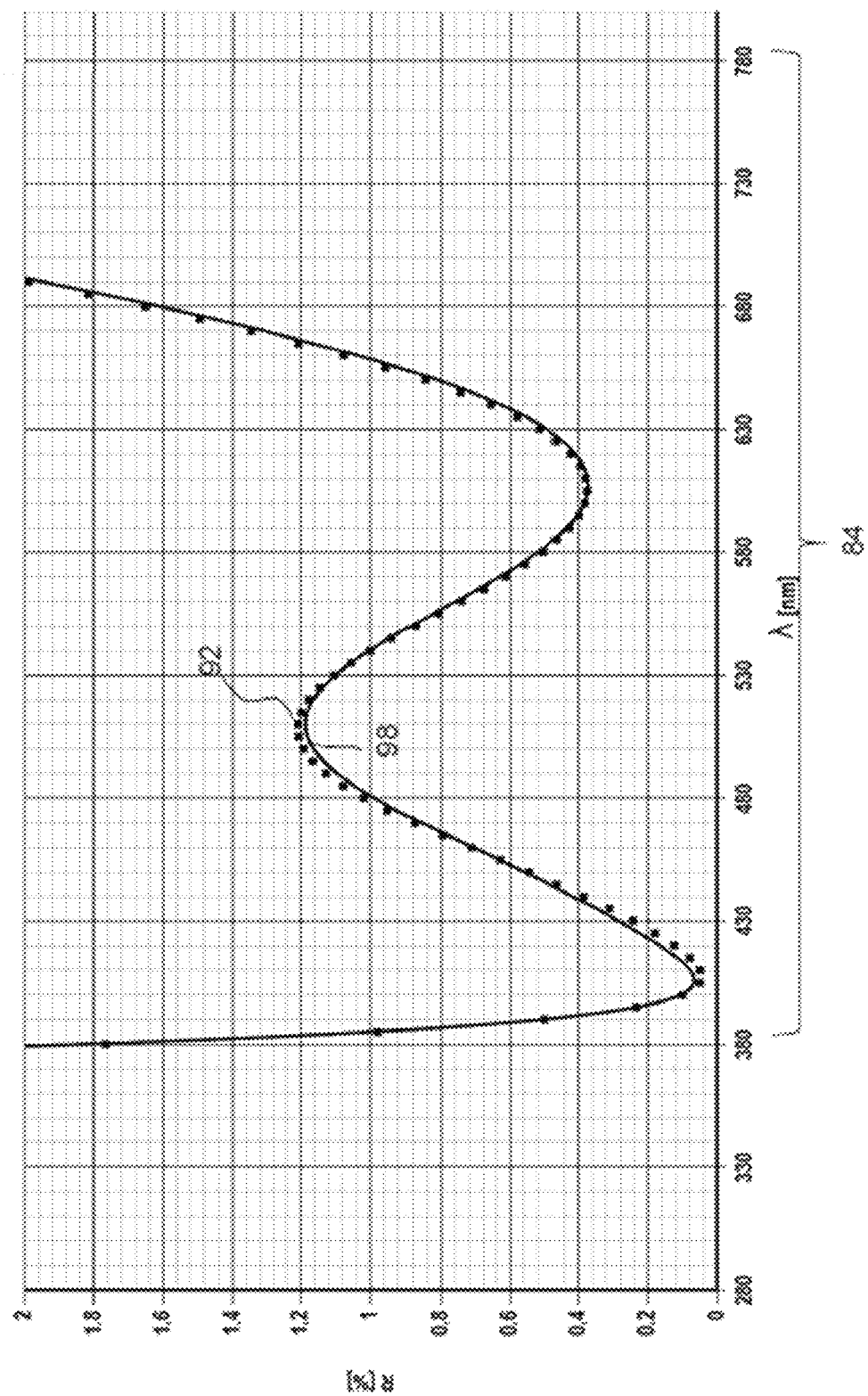
Figure 11:
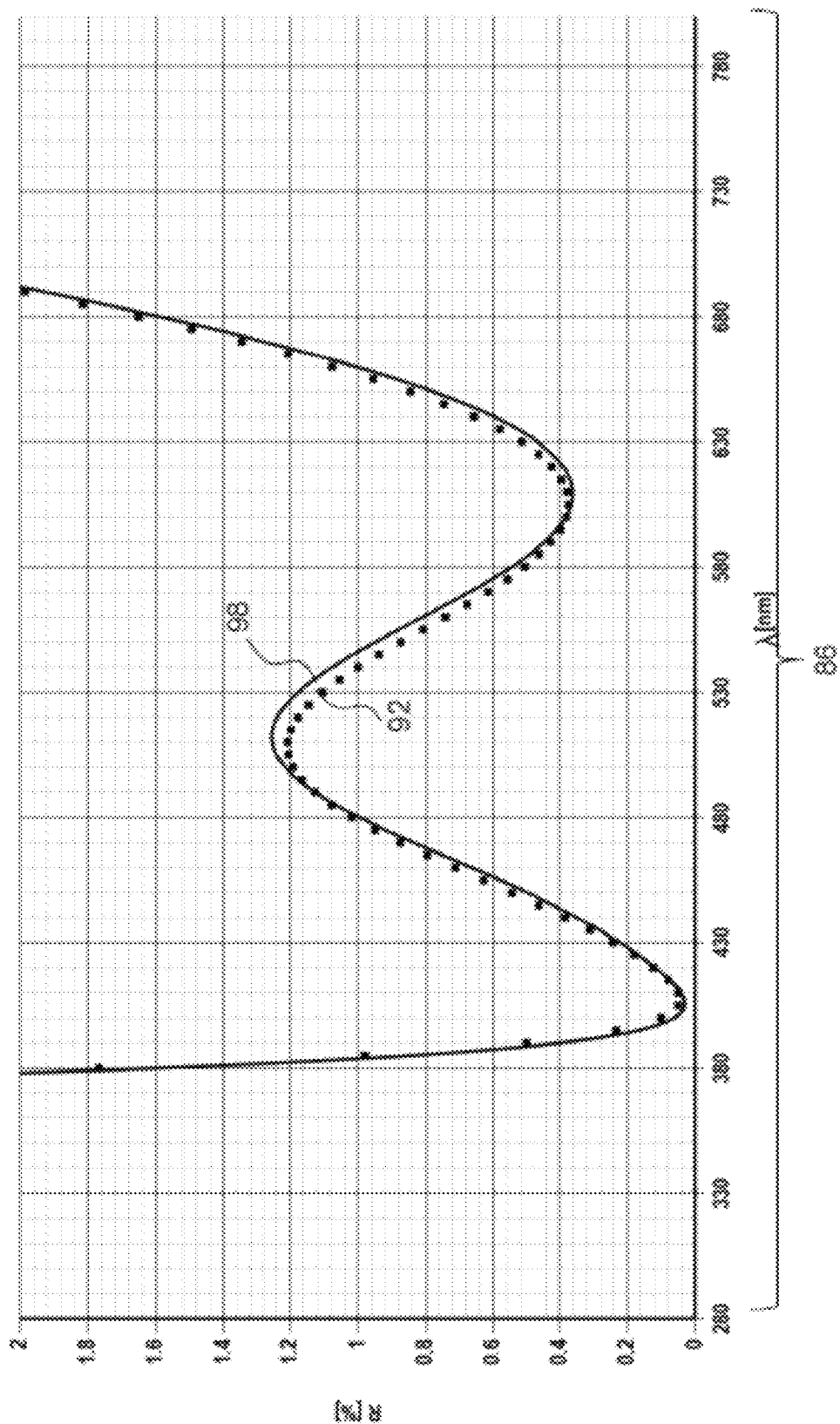
Figure 12:
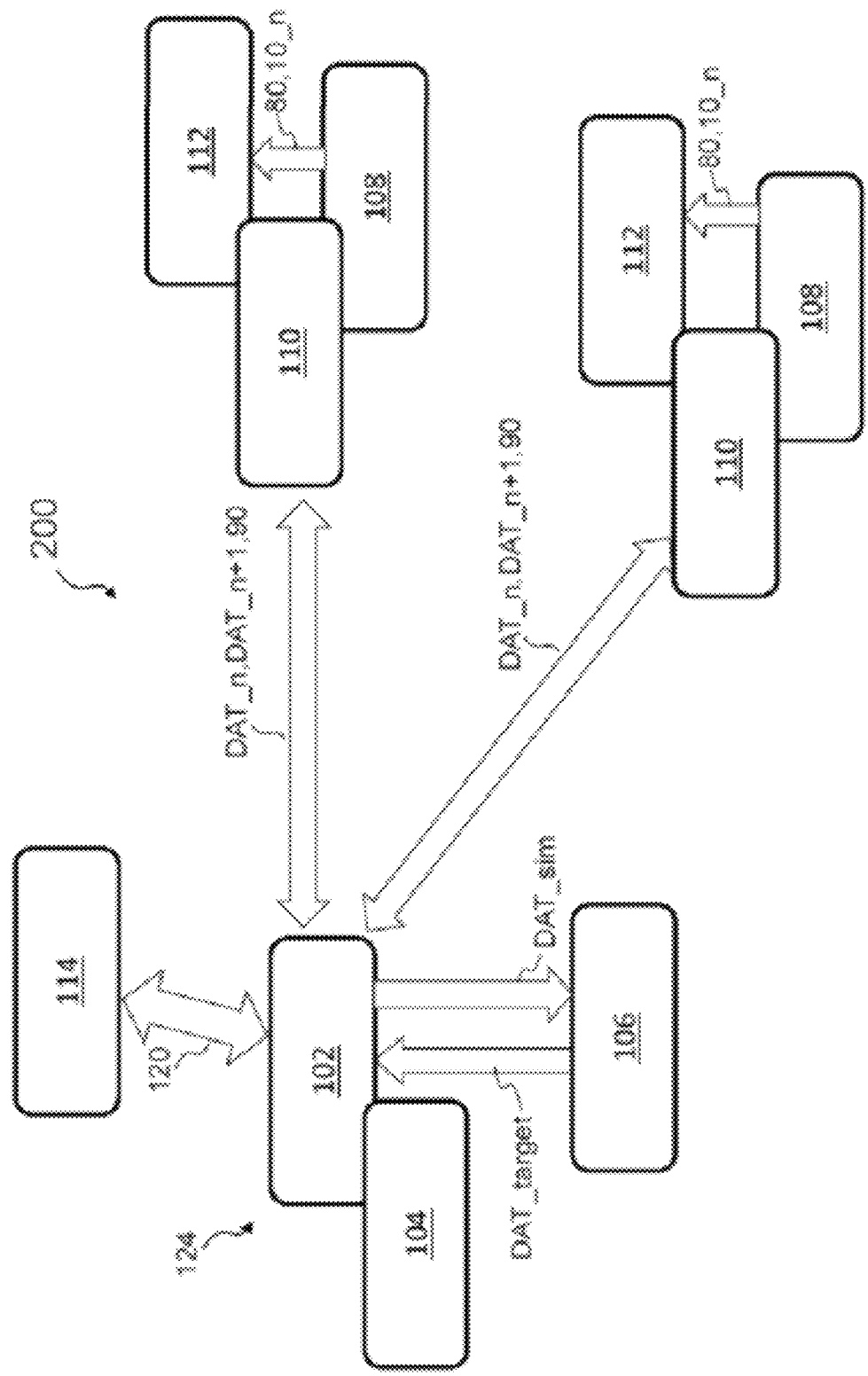

The following show by way of example:

FIG. 1 a block diagram of a coating system according to an example embodiment of the invention;

FIG. 2 a flow diagram of the method for operating at least one coating installation for the production of layer systems for optical elements according to an example embodiment of the invention;

FIG. 3 a flow diagram of the method according to the invention;

FIG. 4 a detailed flow diagram of the method according to the invention;

FIG. 5 an optical element with a layer system of five layer packets on a substrate according to an example embodiment of the invention;

FIG. 6 reflectivity curves of a layer system according to the invention at perpendicular incidence of light with a comparison of an actual measurement curve and a target measurement curve in the wavelength range from 280 nm to 800 nm;

FIG. 7 an enlarged representation of the reflectivity curves of FIG. 6;

FIG. 8 reflectivity curves of the layer system at perpendicular incidence of light with a comparison of the target measurement curve and a scaled simulation target measurement curve;

FIG. 9 reflectivity curves of the layer system at perpendicular incidence of light with a comparison of the target measurement curve and a simulated target measurement curve fitted in a first spectral interval from 380 nm to 580 nm;

FIG. 10 reflectivity curves of the layer system at perpendicular incidence of light with a comparison of the target measurement curve and a simulated target measurement curve fitted in a larger spectral interval from 380 nm to 780 nm;

FIG. 11 reflectivity curves of the layer system at perpendicular incidence of light with a comparison of the actual measurement curve and a simulated target measurement fitted over the entire wavelength range from 280 nm to 800 nm;

FIG. 12 a block diagram of a system of coating installations according to a further example embodiment of the invention.

EMBODIMENTS OF THE INVENTION

In the figures, components of the same kind or having the same effect are numbered with the same reference signs. The figures merely show examples and are not to be understood as limiting.

Directional terminology used in the following, with terms such as "left", "right", "upper", "lower", "before", "behind", "after" and the like, is merely intended to facilitate understanding of the figures and is in no way intended to represent a limitation of generality. The components and elements depicted, their design and use can vary according to the considerations of a person skilled in the art and can be adapted to the respective applications.

FIG. 1 shows a block diagram of a coating system 100 according to an example embodiment of the invention. Advantageously, the coating system 100 can be operable with a self-controlling and feedback control process. The coating system 100 for the production of a layer system 10 for an optical element 80 comprises at least one coating installation 108 for coating a substrate 22 with a layer system 10 for an optical element 80.

The structure of an optical element 80 with a layer system 10 on a substrate 22 is depicted in FIG. 5.

The coating system 100 further comprises a control computer 110 for controlling the coating installation 108 and for communicating with a simulation computer 102, an optical measurement device for determining a spectrally resolved actual measurement curve 90 of the layer system 10, a simulation computer 102 on which simulation software 104 for optical calculation and optimisation of the layer system 10 is installed, a database 106 for storing installation data sets DAT, and an input device 114 for inputting and controlling the simulation computer 102 and/or the coating installation 108 via manual inputs 120.

The database 106 is preferably being employed according to an aspect, in particular an independent aspect, for performing a method according to the first aspect of the invention.

The database 106 serves for storing installation data sets DAT, for a method for operating the coating installation 108 for the production of layer systems 10 for optical elements 80, wherein the installation data sets DAT comprise at least installation data sets DAT_n, DAT_n+1, target data sets DAT_target, simulation actual data sets DAT_actual_sim, and/or simulation target data sets DAT_target_sim.

A computer program product is implemented on the simulation computer 102 for a method according to the first aspect of the invention for operating at least one coating installation 108 for the production of layer systems 10 for optical elements 80, wherein the computer program product comprises at least one computer-readable storage medium which comprises program instructions which are executable on the computer system 102 and cause the computer system 102 to execute the method.

The computer program product can be considered as an independent aspect of the invention, in particular for executing a method according to the first aspect of the invention on a simulation computer 102 of a data processing system 124.

The data processing system 124, which comprises at least the simulation computer 102 and the simulation software 104, serves for the execution of a data processing program which comprises computer-readable program instructions to execute the method for operating the coating installation 108 for the production of layer systems 10 for optical elements 80.

The data processing system 124 can be considered a separate aspect of the invention, particularly for executing a method according to the first aspect of the invention with a simulation computer 102.

The coating installation 108 can optionally comprise a component 116 for the application of an artificial ageing process to the layer system 10 to ensure stable ratios of the optical element 80 when spectrally measuring the layer system 10 in the optical measurement device 112, 118.

In a further option, the coating installation 108 can also comprise an optical measurement device 118 for determining a spectrally resolved actual measurement curve 90 of the layer system 10 so that in-situ measurements of the spectral properties of the layer system 10 can be performed in the coating installation 108 itself and direct feedback can be transmitted to the simulation computer 102.

In FIG. 2, a sequence of the method according to a first aspect of the invention for operating at least one coating installation 108 for the production of layer systems 10 for optical elements 80 according to an example embodiment of the invention is depicted graphically and described in FIGS. 3 and 4 as a flow chart, or as a detailed flow chart, respectively, in individual steps.

In the first step S100 (i), the method for operating the coating installation 108 according to the first aspect of the invention comprises detecting at least one spectral measurement curve with ordinate values and abscissa values as actual measurement curve 90 on an actual layer system 10_$n$ which consists of a sequence of single layers 11, 12, 13, 14, 15, 16, 17, 18, 19, 20 with respective installation actual layer thicknesses d_actual_11, . . . , d_actual_20. The single layers 11, 12, 13, 14, 15, 16, 17, 18, 19, 20 are thereby produced according to an installation data set DAT_n of the coating installation 108. The installation data set DAT_n comprises at least the installation actual layer thicknesses d_actual_11, . . . , d_actual_20 of the single layers 11, 12, 13, 14, 15, 16, 17, 18, 19, 20.

In the next step S102, (ii) associating the actual measurement curve 90 of the actual layer system 10_$n$ according to an association criterion, which in particular can comprise significant spectral points of the actual measurement curve 90, to a target measurement curve 92 of a target data set DAT_target with ordinate values and abscissa values, which is based on a target data set layer system 10_target formed from single layers 11, 12, 13, 14, 15, 16, 17, 18, 19, 20, takes place. The target data set DAT_target comprises at least known target layer thicknesses d_target_11, . . . , d_target_20 of the single layers 11, 12, 13, 14, 15, 16, 17, 18, 19, 20 and can be retrieved from the database 106 via the simulation computer 102.

In a further step S104, (iii) generating a simulation actual measurement curve 94 according to an iterative method by varying at least simulation actual layer thicknesses g_actual_11, . . . , g_actual_20 of the single layers 11, 12, 13, 14, 15, 16, 17, 18, 19, 20 in at least one spectral interval 82 of the actual measurement curve 90 takes place. This results in a final simulation actual data set DAT_actual_sim with at least final simulation actual layer thicknesses g_actual_11, . . . , g_actual_20, by which the actual measurement curve 90 is at least being approximated in the simulation actual measurement curve 94. This iterative method is performed until a termination criterion is reached, for example until a stable result is reached for the association criterion according to a statistical selection method (verifying S114 and query S116 in FIG. 4). As starting values of the simulation actual layer thicknesses g_actual_11, . . . , g_actual_20, for example, the target layer thicknesses d_target_11, . . . , d_target_20 are used in the iterative method.

In the next step S106, (iv) generating a simulation target measurement curve 98 according to an iterative method by varying at least the simulation target layer thicknesses g_target_11, . . . , g_target_20 of the single layers 11, 12, 13, 14, 15, 16, 17, 18, 19, 20 in at least one spectral interval 82 of the target measurement curve 92 takes place. This results in a final simulation target data set DAT_target_sim with at least final simulation target layer thicknesses g_target_11, . . . , g_target_20, by which the target measurement curve 92 is at least being approximated in the simulation target measurement curve 98. This iterative method is performed until a termination criterion is reached, for example until a stable result is reached for the association criterion according to a statistical selection method (verifying S115 and query S117 in FIG. 4). For example, the simulation actual layer thicknesses g_actual_11, . . . , g_actual_20 are used as starting values of the simulation target layer thicknesses g_target_11, . . . , g_target_20 in the iterative method.

In a final step S108, (v) providing the final simulation target data set DAT_target_sim for the coating installation 108 as new installation data set DAT_$n$+1 for the deposition of a further layer system 10_$n$+1 with at least correction actual layer thicknesses d_corr_11, . . . , d_corr_20 as new installation actual layer thicknesses d_actual_11, . . . , d_actual_20 takes place. These are being determined from the final simulation target layer thicknesses g_target_11, . . . , g_target_20 with the final simulation target data set DAT_target_sim.

For generating the simulation actual measurement curve 94, or simulation target measurement curve 98, respectively, in the step S104, or S106, respectively, a scaling factor 122 can be determined in a step S110, or S111, respectively, as a mean value of quotients of abscissa values of the actual measurement curve 90, or the simulation actual measurement curve 94, respectively, and the target measurement curve 92 for abscissa values determined according to the association criterion. With this scaling factor 122, the target layer thicknesses d_target_11, . . . , d_target_20; or the simulation actual layer thicknesses g_actual_11, . . . , g_actual_20, respectively, of the single layers 11, 12, 13, 14, 15, 16, 17, 18, 19, 20 are being scaled and determined as starting values of the simulation actual layer thicknesses g_actual_11, . . . , g_actual_20, or simulation target layer thicknesses g_target_11, . . . , g_target_20.

For generating the simulation actual measurement curve 94, or simulation target measurement curve 98, respectively, in the step S104, or S106, respectively, in each case in a step S112, or S113, respectively, at least for the first interval 82 for each of the single layers 11, 12, 13, 14, 15, 16, 17, 18, 19, 20, a quotient 126 can be formed from the corresponding first final simulation actual layer thickness g_actual_11, . . . , g_actual_20, or the corresponding first final simulation target layer thickness g_target_11, . . . , g_target_20, respectively, and the corresponding installation actual layer thickness d_actual_11, . . . , d_actual_20. With the quotient 126, first simulation actual layer thicknesses g_actual_11, . . . , g_actual_20, or simulation target layer thicknesses g_target_11, . . . , g_target_20, respectively, are being generated by scaling the simulation actual layer thicknesses g_actual_11, . . . , g_actual_20, or simulation target layer thicknesses g_target_11, . . . , g_target_20, respectively, with the quotient 126.

In a step S114, or S115, respectively, the single first simulation actual layer thicknesses g_actual_11, . . . , g_actual_20, or simulation target layer thicknesses g_target_11, . . . , g_target_20, respectively, can be verified for at least one criterion, in particular a plausibility and/or a predetermined deviation from the respective target layer thicknesses g_target_11, . . . , g_target_20 of the target measurement curve 94. If the at least one criterion is being missed, the varying of the simulation actual layer thicknesses g_actual_11, . . . , g_actual_20, or simulation target layer thicknesses g_target_11, . . . , g_target_20, respectively, in the steps S104, S106 and the providing S108 of first final simulation actual layer thicknesses g_actual_11, . . . , g_actual_20, or simulation target layer thicknesses g_target_11, . . . , g_target_20, respectively, as well as the generating of the first simulation actual layer thickness g_actual_11, . . . , g_actual_20, or simulation target layer thickness g_target_11, . . . , g_target_20, respectively, are repeated, wherein for such single layers 11, 12, 13, 14, 15, 16, 17, 18, 19, 20 which have failed the criterion a restriction is being specified when varying S104, S106. Successively, the second simulation actual layer thicknesses g_actual_11, . . . , g_actual_20, or simulation target layer thicknesses g_target_11, . . . , g_target_20, respectively, are provided.

The steps S104, S106, S112, S113, S114, S115 can be repeated in one or more further spectral intervals 84, 86, wherein each successive interval 84, 86 includes the preceding interval 82, 84, and wherein the second simulation actual layer thicknesses g_actual_11, . . . , g_actual_20, or simulation target layer thicknesses g_target_11, . . . , g_target_20, respectively, of the preceding interval 82, 84 are being set as starting values in the successive interval 84, 86 and final simulation actual layer thicknesses g_actual_11, . . . , g_actual_20, or simulation target layer thicknesses g_target_11, . . . , g_target_20, respectively, are provided.

Advantageously, the described method for the production of a layer system 10 for an optical element 80 can be performed such that the iterative method is being performed for one or more spectral intervals 82, 84, 86, wherein each successive interval 84, 86 includes the preceding interval 82, 84. Further, the method described can also be used for running-in a coating process in at least one coating installation 108 for the production of a layer system 10 for an optical element 80.

FIG. 5 shows, in an exemplary manner, an optical element 80 with a layer system 10 on a substrate 22, for example a spectacle lens, according to an example embodiment of the invention. The interferometric reflection-reducing layer system 10 is arranged on at least one surface 24 of the substrate 22. Advantageously, the layer system 10 is producible with a self-controlling and feedback method according to the first aspect of the invention.

As the lowest layer on the substrate 22, the layer system 10 can have, in a conventional manner, a single-layer or multilayer intermediate layer 30, for example to improve the adhesion of the stack 40 and/or as scratch protection for the substrate 22. This intermediate layer 30 can consist, in a conventional manner, for example of sub-stoichiometric low refractive index metal oxides, chromium, silanes or siloxanes. The intermediate layer 30 is not relevant for the further considerations of the optical properties.

In FIG. 5, for example, five layer packets 42, 44, 46, 48, 50 of a stack 40 are arranged successively on the intermediate layer 30.

A stack 40 of at least four, in this example five, successive layer packets 42, 44, 46, 48, 50 is arranged on the intermediate layer 30, wherein each layer packet 42, 44, 46, 48, 50 comprises a pair of first single layers 11, 13, 15, 17, 19 and second single layers 12, 14, 16, 18, 20.

The layer packet 42 nearest to the substrate comprises the single layer 11 nearer to the substrate and the single layer 12 further away from the substrate, the next layer packet 44 comprises the single layer 13 nearer to the substrate and the single layer 14 further away from the substrate, the layer packet 46 successive thereto comprises the single layer 15 nearer to the substrate and the single layer 16 further away from the substrate, the layer packet 48 successive thereto the single layer 17 nearer to the substrate and the single layer 18 further away from the substrate, and the layer packet 50 furthest away from the substrate the single layer 19 nearer to the substrate and the single layer 20 further away from the substrate.

Optionally, the layer packet 50 furthest away from the substrate can have a functional layer 34 between the sub-layer 19 nearer to the substrate and the sub-layer 20 further away from the substrate, which can act, for example, for increasing electrical conductivity, for mechanical stress equalisation, and/or as a diffusion barrier. This functional layer 34 can be formed from a low refractive index material and can be alloyed with other metal oxides such as for example aluminium. For calculation purposes and simulation purposes of the optical properties, the functional layer 34 can be added to the lower refractive index sub-layer 20 of the uppermost layer packet 50, furthest away from the substrate, or, if necessary, it can be disregarded, for example, if the layer thickness is relatively low.

In each layer packet 42, 44, 46, 48, 50, the corresponding first single layers 11, 13, 15, 17, 19 each have a first optical thickness t1 and the corresponding second single layers 12, 14, 16, 18, 20 each have a second optical thickness t2 different from the first optical thickness t1 in the respective layer packet 42, 44, 46, 48, 50.

A refractive index n1 of the respective first single layers 11, 13, 15, 17, 19 nearer to the substrate is greater than a refractive index n2 of the respective second single layers 12, 14, 16, 18, 20 further away from the substrate of the stack 40. The layer system 10 has a lightness L*, a chroma C*, and a hue angle h of a residual reflection colour, wherein the value of a change $\Delta h$ in the hue angle h of the residual reflection colour in an interval of a viewing angle AOI with the boundary values of 0° and 30°, relative to a surface normal 70 onto the layer system 10, is smaller than the value of a change $\Delta C^*$ in the chroma C* in the interval of the viewing angle AOI.

The layer system is viewed by an observer at a viewing angle AOI of 0° to a boundary angle, for example 30°, measured from the surface normal 70.

To design the layer system 10, the following steps are favourably performed:

Defining a layer design, comprising at least a first material for high refractive index first single layers 11, 13, 15, 17, 19 and a second material for low refractive index second single layers 12, 14, 16, 18, 20, number of desired layer packets 42, 44, 46, 48, 50 with the single layers 11, 12, 13, 14, 15, 16, 17, 18, 19, 20, starting values of the thickness of the single layers 11, 12, 13, 14, 15, 16, 17, 18, 19, 20;

Defining target colour values comprising lightness L*, chroma C*, and hue angle h at least at boundary values for an interval of a viewing angle AOI with boundary values of 0° and 30°;

Performing an optimisation method for varying the single layer thicknesses d_actual_11, . . . , d_actual_20 until an optimisation objective is reached.

The substrate 22 is, for example, a plastic, in particular a transparent plastic for a spectacle lens.

In particular, the term spectacle lens in the context of the present disclosure refers to a coated spectacle lens according to section 8.1.13 of the standard DIN EN ISO 13666:2013-10, thus a spectacle lens to which one or more surface coatings have been applied, in particular to modify one or more of its properties.

Preferably, such spectacle lenses can be advantageously deployed in particular as spectacles (with and without correction), sunglasses, ski goggles, workplace goggles, as well as spectacles in connection with head-worn display devices (so-called "head-mounted displays").

In the context of the present disclosure, the term spectacle lens can further comprise semi-finished spectacle lens products, in particular a spectacle lens blank or semi-finished spectacle lens product according to section 8.4.2 of the standard DIN EN ISO 13666:2013-10, i.e. a lens blank or blank with only one optically finished surface.

Referring to the designs in FIG. 5, the opposite surface 26 of the substrate 22 can optionally have another, similar or identical layer system 10, no coating, or only protective coating (not shown).

Preferably, each of the single layers 11, 13, 15, 17, 19 nearer to the substrate is formed from an identical first material. Preferably, the first material is a higher refractive index material with a first refractive index n1.

Preferably, each of the single layers 12, 14, 16, 18, 20 further away from the substrate is formed from an identical second material. Preferably, the second material is a low refractive index material with a second refractive index n2. The refractive index n1 is greater than the refractive index n2, preferably the difference of the refractive indices n1, n2 is at least 0.2, preferably up to at least 0.5.

The order of the first single layers 11, 13, 15, 17, 19 and second single layers 12, 14, 16, 187, 20 remains the same in the stack 40, so that in each layer packet 42, 44, 46, 48, 50 the respective first single layer 11, 13, 15, 17, 19 nearer to the substrate is always the higher refractive index one and the respective second single layer 12, 14, 16, 18, 20 further away from the substrate is always the lower refractive index one of the single layers 11, 12, 13, 14, 15, 16, 17, 18, 19, 20.

In particular, the higher refractive index single layers 11, 13, 15, 17, 19 can be layers of high refractive index materials and the lower refractive index single layers 12, 14, 16, 18, 20 can be layers of low refractive index materials.

The layer packets 42, 44, 46, 48, 50 in the stack 40 differ only in their respective thickness and/or in the thicknesses of the individual single layers 11, 12, 13, 14, 15, 16, 17, 18, 19, 20 in each layer packet 42, 44, 46, 48, 50.

In a manner known per se, the stack 40 is terminated with a cover layer 32 which serves, for example, for maintaining the layer system 10. The cover layer 32 is applied to the last optically relevant single layer 20 of the uppermost layer packet 50 of the stack 40 and can, for example, contain fluorine-containing molecules. The cover layer 32 usually imparts an improved maintenance property to the stack 40, with properties such as a water repellent and oil repellent function at a surface energy of typically less than 15 mN/m.

The cover layer 32 is not further relevant for further considerations of the optical properties of the layer system 10.

The optical properties of the stack 40 of the layer system 10 can be simulated computationally by means of calculation methods and/or optimisation methods known as such. The layer system 10 is then produced with the determined layer thicknesses of the single sub-layers 60, 62 of the layer packets 42, 44, 46, 48, 50.

In the production of optical layer systems 10, its optical properties of the layer system 10 are adjusted during the production of the sub-layers 60, 62. For example, the method known from WO 2016/110339 A1 can be used, which is briefly outlined below. With the known method, various optical effects such as mirroring or reflection reduction can be achieved in a material system by only changing the layer thicknesses but keeping the material used the same. However, other methods are also possible.

By varying the thicknesses of the layer packets as described in WO 2016/110339 A1 while keeping the materials the same, different reflectivities can be achieved, especially for a reflection-reducing effect. This is achieved by minimising or optimising, respectively, a parameter σ. The parameter σ is in turn a function of the layer thicknesses of the single layers 11, 12, 13, 14, 15, 16, 17, 18, 19, 20, or of ratios of the optical thicknesses t1, t2 of the single layers 11, 12, 13, 14, 15, 16, 17, 18, 19, 20, respectively, of each of the four layer packets 42, 44, 46, 48 (not shown) or five layer packets 42, 44, 46, 48, 50 according to FIG. 5, respectively, in the stack 40.

At a certain wavelength λ, the optical thickness t of a layer, also called FWOT (full wave optical thickness), is determined as $$t = \frac{d}{\lambda} \cdot n$$

wherein d represents the layer thickness, λ represents the design wavelength, and n represents the refractive index of the single layers 11, 12, 13, 14, 15, 16, 17, 18, 19, 20.

A reflection-reducing effect by the stack 40 can be achieved for a predeterminable reflectivity $R_m$ of the stack 40 if the product of reflectivity $R_m$ and the parameter σ is set to smaller than 1:

$$R_m \cdot \sigma < 1$$

The reflectivity $R_m$, also called reflectance, here describes the ratio of reflected to incident intensity of a light beam as energy quantity. The reflectivity $R_m$ is expediently averaged over the range of the light from 380 nm to 800 nm and referred to 100%.

Such a condition $R_m \cdot \sigma < 1$ can be applied as boundary condition for an optimisation process of the method for the production of the layer system 10.

The optical thicknesses t1, t2 of the first and second single layers 11, 12, 13, 14, 15, 16, 17, 18, 19, 20 of the layer packets 42, 44, 46, 48, 50 are determined by determining the parameter a by means of an optimisation method, preferably by means of a variational calculation.

Therein, preferably, the thicknesses of the respective single layers 11, 12, 13, 14, 15, 16, 17, 18, 19, 20, when five layer packets 42, 44, 46, 48, 50 are in the stack 40, are formed as a function of a quotient $v_i$ (with i=1, 2, 3, 4, 5) of the first optical thickness t1 of the respective higher refractive index first single layers 11, 13, 15, 17, 19 and the second optical thickness t2 of the lower refractive index second single layers 12, 14, 16, 18, 20 of the respective layer stack 42, 44, 46, 48, 50.

In an advantageous design, in a layer system 10 according to FIG. 5, the parameter a for a stack 40 with five successive layer packets 42, 44, 46, 48, 50 can be determined from the relationship $$\sigma = \frac{v_1}{\sum_{i=2}^{nmax} v_i},$$

where i=runs from 2 to nmax=5.

The indices i=1, 2, 3, 4, 5 stand for the order of the layer packets 42, 44, 46, 48, 50 on the substrate 22. Accordingly, $v_1$ stands for the layer packet 42 nearest to the substrate and $v_5$ stands for the layer packet 50 furthest away from the substrate.

It is known to specify perceptually related colours in the so-called CIE-L*a*b* colour space (simplified CIELab colour space) in Cartesian coordinates, as set out in DIN EN ISO 1 1664-4:2012-06 (EN ISO 11664-4:2011).

L* is the CIELab lightness, a*, b* are the CIELab coordinates, C* is the CIELab chroma, and $h_{ab}$ is the CIELab hue angle.

The L*-axis describes the lightness (luminance) of the colour with values from 0 to 100. The L*-axis is perpendicular to the a*b*-plane at the zero point. It can also be called the neutral grey axis, because between the end points black (L*=0) and white (L*=100) all achromatic colours (grey tones) are contained.

On the a*-axis, green and red are opposite each other, the b*-axis runs between blue and yellow. Complementary colour tones are opposite each other by 180°, in their centre, i.e. the coordinate origin a*=0, b*=0, is grey.

The a*-axis describes the green component or red component of a colour, wherein negative values stand for green and positive values for red. The b*-axis describes the blue component or yellow component of a colour, wherein negative values stand for blue and positive values for yellow.

The a*-values range from about −170 to +100, the b*-values range from −100 to +150, wherein the maximum values only being reached at medium lightness of certain colour tones. The CIELab colour body has its greatest extent in the medium lightness range, but this extent varies in height and size depending on the colour range.

The CIELab hue angle $h_{ab}$ must be between 0° and 90° if both a* and b* are positive, between 90° and 180° if b* is positive and a* is negative, between 180° and 270° if both a* and b* are negative, and between 270° and 360° if b* is negative and a* is positive.

In the CIE-L*C*h colour space (simplified CIELCh colour space), the Cartesian coordinates of the CIELab colour space are transformed into polar coordinates. The cylindrical coordinates C* (chroma, relative colour saturation, distance from the L-axis in the centre) and h (hue angle, angle of the colour tone in the CIELab colour circle) are specified. The CIELab lightness L* remains unchanged.

The hue angle h results from the a*- and b*-axes $$h = \arctan\left(\frac{b^*}{a^*}\right)$$

The hue angle h here stands for the colour of the residual reflection of the reflection-reducing layer system 10.

The chroma C* results in $$C^* = \sqrt{(a^*)^2 + (b^*)^2}$$

The chroma C* is also called the colour depth.

To set the layer thicknesses d_target_11, . . . , d_target_20 of the single layers 11, 12, 13, 14, 15, 16, 17, 18, 19, 20, an optimisation method is performed for varying the single layer thicknesses d_target_11, . . . , d_target_20 until an optimisation target is reached. The optimisation method then varies the single layer thicknesses d_target_11, . . . , d_target_20 until the optimisation target (colour stability) is reached.

The hue angle h can thereby change in the interval of the viewing angle AOI with the boundary values 0° and 30° by at most 15°, preferably by at most 10°. The value of the change Δh in the hue angle h in a second interval of a viewing angle AOI from 0° up to a boundary viewing angle θ with upper boundary values 30° and 45°, relative to the surface normal 70 onto the layer system 10, can be smaller than the value of a change ΔC* in the chroma C* in the second interval of the viewing angle AOI and the value of the chroma C* at the boundary viewing angle θ can be at least θ=2, in particular, the hue angle h in the second interval can change by at most 20°, preferably by at most 15°.

The photopic reflectance Rv in the interval of the viewing angle AOI with the boundary values 0° and 30° can advantageously be at most 1.5%, preferably at most 1.2%.

The scotopic reflectance Rv' in the interval of the viewing angle AOI with the boundary values 0° and 30° can advantageously be at most 1.5%, preferably at most 1.2%.

In FIGS. 6 to 11, reflectivity curves at perpendicular incidence of light as actual measurement curves 90 together with target measurement curves 92, or simulation actual measurement curves 94, respectively, are respectively depicted.

FIG. 6 shows reflectivity curves of a layer system 10 according to the invention with a comparison of an actual measurement curve 90 (solid line) and a target measurement curve 92 (dotted line) in the wavelength range from 280 nm to 800 nm; FIG. 7 shows an enlarged representation of the reflectivity curves of FIG. 6. The target measurement curve 92 was determined by means of an extreme value comparison from the database 106 as target measurement curve 92 to the actual measurement curve 90. A strong peak shift can be seen in the low wavelength range between 280 nm and 380 nm and in the enlarged representation in FIG. 7 in the wavelength range from 380 nm and 680 nm.

In FIG. 8, reflectivity curves of the layer system 10 with a comparison of the target measurement curve 92 (dotted line) and a scaled simulation target measurement curve 98 (solid line) are depicted. Thus, a horizontal shift of the simulation target measurement curve 98 took place. The complete layer system 10 was scaled, i.e. the vector that contains all physical layer thicknesses g_target_11, . . . , g_target_20 of the single layers 11, 12, 13, 14, 15, 16, 17, 18, 19, 20 representing the layer system 10 was multiplied by a scaling factor 122, i.e. each single layer 11, 12, 13, 14, 15, 16, 17, 18, 19, 20 was made thicker, or thinner, respectively, by the same scaling factor 122.

FIG. 9 shows reflectivity curves of the layer system 10 with a comparison of the target measurement curve 92 and a simulation target measurement curve 98 fitted thereto in a first spectral interval 82 from 380 nm to 580 nm. Therein, the simplex algorithm was applied for the iterative optimisation method. The algorithm was started with the optimisation target of mapping the simulation target measurement curve 98 from the previous step as accurately as possible to the target measurement curve 92 in the interval 380 nm to 580 nm by changing the physical layer thicknesses g_target_11, . . . , g_target_20. This results in a very good approximation of both measurement curves 92, 98 in the selected interval 82.

FIG. 10 shows reflectivity curves of the layer system 10 with a comparison of the target measurement curve 92 and a simulated target measurement curve 98 fitted thereto in a larger spectral interval 84 from 380 nm to 780 nm. This time a simplex optimisation was applied in the larger interval 84 from 380 nm to 780 nm. No layer thickness relations were taken into account. In the lower wavelength range around 400 nm, the quality of the agreement between both measurement curves 92, 98 is slightly worse, while it is better in the upper wavelength range from 580 nm to 680 nm.

FIG. 11 shows reflectivity curves of the layer system 10 with a comparison of the target measurement curve 92 and a simulation target measurement curve 98 fitted thereto over the entire wavelength range as an interval 86 from 280 nm to 800 nm. This time a simplex optimisation was applied in the larger interval 86 from 280 nm to 800 nm. No layer thickness relations were taken into account. The quality of the agreement between both measurement curves 92, 98 has slightly worsened in the middle wavelength range from 480 nm to 580 nm, but on average improved in the entire wavelength range from 280 nm to 800 nm.

FIG. 12 shows a block diagram of a system 200 of coating installations 108 according to a further embodiment of the invention. The system 200 can also be considered as a stand-alone system which is operable with a self-controlling and feedback control process according to the first aspect of the invention. In this regard, the system 200 of coating installations 108 for the production of layer systems 10 for optical elements 80 comprises two coating installations 108 for coating a substrate 22 with a layer system 10 for an optical element 80, a respective control computer 110 for controlling a coating installation 108 and for communicating with a simulation computer 102, one optical measurement device 112 per coating installation 108 for determining a spectrally resolved actual measurement curve 90 of the layer system 10, and a simulation computer 102 on which simulation software 104 for optical calculation and optimisation of the layer system 10 is installed, and which communicates with the control computers 102 of the coating installations 108. The system 200 further comprises a database 106 for storing installation data sets DAT, an input device 114 for inputting and controlling the simulation computer 102 and/or the coating installations 108. With such a system 200 of coating installations 108, it is advantageously possible to control multiple coating installations 108 via one simulation computer 102 and to run-in and/or optimise the coating processes for the manufacture of optical elements 80 with layer systems 10.

The invention claimed is:

1. A method for producing a layer system, comprising:
   operating at least one coating installation to produce a layer system for optical elements, the produced layer system consisting of one or more single layers, each with an installation actual layer thickness of the respective single layer, wherein the one or more single layers are produced according to an installation data set of the at least one coating installation, wherein the installation data set comprises at least the installation actual layer thickness of the respective single layer of the one or more single layers;
   performing an automatic process including:
      detecting, by an optical measurement device, at least one spectral measurement curve with ordinate values and abscissa values as actual measurement curve on the produced layer system;
      associating, by a simulation computer, the actual measurement curve of the actual layer system according to at least one association criterion to a target measurement curve of a target data set with ordinate values and abscissa values, which is based on a target data set layer system formed from one or more single layers, wherein the target data set comprises at least one known target layer thickness of the respective single layer of the one or more single layers;
      generating, by the simulation computer, a simulation actual measurement curve according to an iterative method by varying at least one simulation actual layer thickness of the respective single layer in at least one spectral interval of the actual measurement curve and obtaining a final simulation actual data set with at least one final simulation actual layer thickness of the respective single layer of the one or more single layers, by which the actual measurement curve is at least being approximated in the simulation actual measurement curve until a termination criterion is reached, wherein the simulation actual measurement curve is generated from the actual measurement curve and the target data set comprising the at least one known target layer thickness of the respective single layer of the one or more single layers;
      generating, by the simulation computer a simulation target measurement curve according to an iterative method by varying at least a simulation target layer thickness of the respective single layer in at least one spectral interval of the target measurement curve and obtaining a final simulation target data set with at least one final simulation target layer thickness of the respective single layer of the one or more single layers, by which the target measurement curve is at least being approximated in the simulation target measurement curve until a termination criterion is reached, wherein optical differences between the actual measurement curve and the simulation actual measurement curve are correlated and the final simulation actual data set is used for calculation of the simulation target measurement curve to match with the target measurement curve, wherein the simulation target measurement curve is generated from the target measurement curve and the final simulation actual data set with the at least one final simulation actual layer thickness of the respective single layer of the one or more single layers; and
      sending the final simulation target data set to the at least one coating installation as new installation data set; and
   operating the at least one coating installation to produce an optical element by coating a further layer system on a substrate with at least one correction actual layer thickness as new installation actual layer thickness of the respective single layer, which are being determined from the final simulation target layer thickness of the respective single layer of the one or more single layers with the final simulation target data set.

2. The method according to claim 1, wherein the termination criterion is reached when at least one of the following conditions is met:
   a stable result is being reached for the association criterion according to a statistical selection method;
   a deviation between the actual measurement curve and the simulation actual measurement curve is within a tolerance range; and
   a maximum number of iterations has been performed.

3. The method according to claim 2,
   wherein the target layer thickness of the respective single layer is being used as starting value of the simulation actual layer thickness of the respective single layer; and/or
   wherein the simulation actual layer thickness of the respective single layer is being used as starting value of the simulation target layer thickness of the respective single layer; and/or wherein a predetermined layer thickness of the respective single layer is being used as starting value of the simulation target layer thickness of the respective single layer.

4. The method according to claim 2, for generating the simulation actual measurement curve, or simulation target measurement curve, respectively, further comprising:
determining a scaling factor as mean value of quotients of abscissa values of the actual measurement curve, or simulation actual measurement curve, respectively, and the target measurement curve for abscissa values determined according to the association criterion, and scaling the target layer thickness; or the simulation actual layer thickness, respectively, of the respective single layer with the scaling factor as starting values of the simulation actual layer thickness, or the simulation target layer thickness, respectively, of the respective single layer of the one or more single layers.

5. The method according to claim 1,
wherein the target layer thickness of the respective single layer is being used as starting value of the simulation actual layer thickness of the respective single layer; and/or
wherein the simulation actual layer thickness of the respective single layer is being used as starting value of the simulation target layer thickness of the respective single layer; and/or
wherein a predetermined layer thickness of the respective single layer is being used as starting value of the simulation target layer thickness of the respective single layer.

6. The method according to claim 5, for generating the simulation actual measurement curve, or simulation target measurement curve, respectively, further comprising:
determining a scaling factor as mean value of quotients of abscissa values of the actual measurement curve, or simulation actual measurement curve, respectively, and the target measurement curve for abscissa values determined according to the association criterion, and scaling the target layer thickness; or the simulation actual layer thickness, respectively, of the respective single layer with the scaling factor as starting values of the simulation actual layer thickness, or the simulation target layer thickness, respectively, of the respective single layer of the one or more single layers.

7. The method according to claim 1, for generating the simulation actual measurement curve, or simulation target measurement curve, respectively, further comprising:
determining a scaling factor as mean value of quotients of abscissa values of the actual measurement curve, or simulation actual measurement curve, respectively, and the target measurement curve for abscissa values determined according to the association criterion, and scaling the target layer thickness; or the simulation actual layer thickness, respectively, of the respective single layer with the scaling factor as starting values of the simulation actual layer thickness, or the simulation target layer thickness, respectively, of the respective single layer of the one or more single layers.

8. The method according to claim 1, for generating the simulation actual measurement curve, or simulation target measurement curve, respectively, further comprising:
at least for the first interval for the one or each of the multiple single layers, forming a quotient of the corresponding first final simulation actual layer thickness, or the corresponding first final simulation target layer thickness, respectively, and the corresponding installation actual layer thickness, wherein a first simulation actual layer thickness, or a simulation target layer thickness, respectively, of the respective single layer are being generated by scaling the simulation actual layer thickness, or simulation target layer thickness, respectively, of the respective single layer of the one or more single layers with the quotient.

9. The method according to claim 8, for generating the simulation actual measurement curve, or simulation target measurement curve, respectively, further comprising:
verifying the single first simulation actual layer thickness, or the one simulation target layer thickness, respectively, of the respective single layer for at least one criterion,
and, if the at least one criterion is being missed,
repeating the varying of the simulation actual layer thickness, or the simulation target layer thickness, respectively, of the respective single layer and the providing of a first final simulation actual layer thickness, or simulation target layer thickness, respectively, of the respective single layer as well as the generating of the first simulation actual layer thickness, or simulation target layer thickness, respectively, wherein for the respective single layer of the one or more single layers which has failed the criterion a restriction is being specified when varying, and
providing a second simulation actual layer thickness, or simulation target layer thickness, respectively, of the respective single layer of the one or more single layers.

10. The method according to claim 8, comprising:
repeating the steps in one or more further spectral intervals, wherein each successive interval includes the preceding interval, wherein the second simulation actual layer thickness, or simulation target layer thickness, respectively, of the respective single layer of the preceding interval are being set as starting values in the successive interval, and
providing a final simulation actual layer thickness, or simulation target layer thickness, respectively, of the respective single layer of the one or more single layers.

11. The method according to claim 1, wherein an interferometric reflection-reducing layer system is being deposited on at least one surface of a substrate,
wherein the layer system comprises a stack of at least four successive layer packets, wherein each layer packet comprises a pair of first and second single layers, wherein the first single layers have a first optical thickness and the second single layers have a second optical thickness different from the first optical thickness,
wherein a refractive index of the respective first single layers nearer to the substrate is greater than a refractive index of the respective second single layers further away from the substrate of the stack,
wherein the layer system has a lightness, a chroma, and a hue angle of a residual reflection colour,
wherein the value of a change in the hue angle of the residual reflection colour in an interval of a viewing angle with the boundary values of 0° and 30°, relative to a surface normal onto the layer system, is smaller than the value of a change in the chroma in the interval of the viewing angle, wherein the following steps are being carried out:
defining a layer design, comprising at least a first material for high refractive index first single layers and a second material for low refractive index second single layers, number of desired layer packets with the single layers, starting values of the thickness of the single layers;

defining target colour values comprising lightness, chroma, and hue angle at least at boundary values for an interval of a viewing angle with boundary values of 0° and 30°;

performing an optimisation method for varying the single layer thicknesses until an optimisation target is reached.

12. The method according to claim 11, wherein the hue angle in the interval of the viewing angle with the boundary values 0° and 30° changes by at most 15°; and/or wherein the value of the change in the hue angle in a second interval of a viewing angle from 0° up to a boundary viewing angle with an upper boundary value between 30° and 45°, relative to the surface normal onto the layer system, is smaller than the value of a change in the chroma in the second interval of the viewing angle, and the value of the chroma at the boundary viewing angle is at least 2; and/or wherein the photopic reflectance in the interval of the viewing angle with the boundary values 0° and 30° is at most 1.5%; and/or wherein the scotopic reflectance in the interval of the viewing angle with the boundary values 0° and 30° is at most 1.5%.

13. A method for the production of a layer system in at least one coating installation with the method according to claim 1, wherein the layer system is being produced based on a final simulation target data set for the coating installation.

14. A method for running-in a coating process in at least one coating installation for the production of a layer system with the method according to claim 1, wherein an actual measurement curve of a spectral measurement curve with ordinate values and abscissa values is at least being approximated in a simulation actual measurement curve until a termination criterion is reached.

15. A coating system for the production of a layer system, with the method according to claim 1, comprising at least:

the coating installation for coating a substrate with a layer system for an optical element, a control computer for controlling the coating installation and for communicating with a simulation computer, the optical measurement device for determining a spectrally resolved actual measurement curve of the layer system, the simulation computer on which simulation software for optical calculation and optimisation of the layer system is installed, wherein the simulation computer is configured to correlate optical differences between the actual measurement curve and the simulation actual measurement curve so that the simulation actual data set is used for calculation of the simulation target measurement curve back to the target measurement curve, a database for storing installation data sets, and an input device for inputting and controlling the simulation computer and/or the coating installation.

16. The coating system according to claim 15, wherein one or more coating installations each comprise an optical measurement device and a control computer for controlling the coating installation and for communicating with a simulation computer.

17. A computer program product for a method for operating at least one coating installation for the production of layer systems, wherein the computer program product comprises at least one non-transitory computer-readable storage medium which comprises program instructions which are executable on a computer system and cause the computer system to execute the method according to claim 1.

18. The method according to claim 1, wherein the optical element is a spectacle lens.

* * * * *